United States Patent
Honjo et al.

(10) Patent No.: US 10,586,580 B2
(45) Date of Patent: Mar. 10, 2020

(54) MAGNETIC TUNNEL JUNCTION ELEMENT AND MAGNETIC MEMORY

(71) Applicant: TOHOKU UNIVERSITY, Sendai-shi, Miyagi (JP)

(72) Inventors: Hiroaki Honjo, Sendai (JP); Shoji Ikeda, Sendai (JP); Hideo Sato, Sendai (JP); Tetsuo Endoh, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/308,166

(22) PCT Filed: May 19, 2017

(86) PCT No.: PCT/JP2017/018779
§ 371 (c)(1),
(2) Date: Dec. 7, 2018

(87) PCT Pub. No.: WO2017/212895
PCT Pub. Date: Dec. 14, 2017

(65) Prior Publication Data
US 2019/0304526 A1    Oct. 3, 2019

(30) Foreign Application Priority Data
Jun. 8, 2016  (JP) .............................. 2016-114377

(51) Int. Cl.
*G11C 11/16* (2006.01)
*H01L 27/22* (2006.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC .................................................. G11C 11/161
See application file for complete search history.

(56) References Cited

U.S. PATENT DOCUMENTS 9,337,415 B1    5/2016  Oh et al.
2010/0276771 A1*  11/2010  Fukumoto .............. B82Y 25/00
                                                257/421
(Continued)

FOREIGN PATENT DOCUMENTS

JP    2012-064625 A    3/2012
JP    2012-235015 A    11/2012
(Continued)

OTHER PUBLICATIONS

Sato et al, "Perpendicular-anisotropy CoFeB-MgO magnetic tunnel junctions with a MgO/CoFeB/Ta/CoFeB/MgO recording structure", Applied Physics Letters, 101, 022414, 2012.
(Continued)

*Primary Examiner* — Huan Hoang
*Assistant Examiner* — Jay W. Radke
(74) *Attorney, Agent, or Firm* — Oliff PLC

(57) ABSTRACT

A magnetic tunnel junction element with a high tunnel magnetic resistance ratio can prevent a recording layer from being damaged. A reference layer includes a ferromagnetic body, and has magnetization direction fixed in the vertical direction. A barrier layer includes non-magnetic body, and disposed on one surface side of the reference layer. A recording layer is disposed to sandwich barrier layer between itself and reference layer. The recording layer includes a first ferromagnetic layer including at least one of Co and Fe, and having a magnetization direction variable in a vertical direction; a first non-magnetic layer including at least one of Mg, MgO, C, Li, Al, and Si, second non-magnetic layer including at least one of Ta, Hf, W, Mo, Nb, Zr, Y, Sc, Ti, V, and Cr, and second ferromagnetic layer
(Continued)

including at least one of Co and Fe, and having a magnetization direction variable in a vertical direction.

8 Claims, 15 Drawing Sheets

(51) Int. Cl.
    *H01L 43/10*     (2006.01)
    *H01L 27/105*     (2006.01)
    *H01L 29/82*     (2006.01)
    *H01L 21/8239*     (2006.01)
    *H01L 43/02*     (2006.01)
    *H01L 43/08*     (2006.01)

(52) U.S. Cl.
    CPC ...... *G11C 11/1659* (2013.01); *G11C 11/1673* (2013.01); *G11C 11/1675* (2013.01); *H01L 21/8239* (2013.01); *H01L 27/105* (2013.01); *H01L 27/228* (2013.01); *H01L 29/82* (2013.01); *H01L 43/10* (2013.01); *H01L 43/02* (2013.01); *H01L 43/08* (2013.01)

(56) References Cited

U.S. PATENT DOCUMENTS

| | | | |
|---|---|---|---|
| 2011/0298067 A1* | 12/2011 | Ishiwata | ............ G11C 11/16 257/421 |
| 2012/0063221 A1 | 3/2012 | Yamane et al. | |
| 2012/0063222 A1 | 3/2012 | Yamane et al. | |
| 2012/0205758 A1* | 8/2012 | Jan | ............ H01L 29/66984 257/421 |
| 2012/0281462 A1 | 11/2012 | Bessho et al. | |
| 2013/0075845 A1 | 3/2013 | Chen et al. | |
| 2014/0042573 A1 | 2/2014 | Yamane et al. | |
| 2014/0254253 A1 | 9/2014 | Uchida et al. | |
| 2015/0109853 A1 | 4/2015 | Sato et al. | |
| 2015/0263068 A1* | 9/2015 | Ito | ............ H01L 27/228 365/158 |
| 2016/0072053 A1 | 3/2016 | Yamane et al. | |
| 2016/0126453 A1 | 5/2016 | Chen et al. | |

FOREIGN PATENT DOCUMENTS

| | | |
|---|---|---|
| JP | 2014-207469 A | 10/2014 |
| JP | 2014-530503 A | 11/2014 |
| WO | 2013/069091 A1 | 5/2013 |
| WO | 2013/153942 A1 | 10/2013 |

OTHER PUBLICATIONS

Jun. 27, 2017 International Search Report issued in International Patent Application No. PCT/JP2017/018779.

* cited by examiner (a)

(b)

MAGNETIC TUNNEL JUNCTION ELEMENT AND MAGNETIC MEMORY

FIELD OF THE INVENTION

The present invention relates to a magnetic tunnel junction element and a magnetic memory.

DESCRIPTION OF RELATED ART

The magnetization reversal using spin transfer torque (hereinafter, referred to as "STT") is suitable for a memory element having high density and small power consumption, because a current value required for writing is reduced as the element size is smaller. In recent years, a magnetic memory using magnetization reversal by STT (STT-MRAM) has been drawing attention.

The magnetic memory using magnetization reversal by STT includes a magnetic tunnel junction element (MTJ element). The MTJ element has a configuration in which a reference (fixed) layer whose magnetization direction is fixed and a recording (free) layer whose magnetization direction varies sandwich a tunnel barrier layer (tunnel insulating film).

The performance of the MTJ element is represented by a tunnel magnetoresistance ratio (TMR ratio), thermal stability, and a threshold current. The tunnel magnetoresistance ratio is a value defined by: $(R_{ap}-R_p)/R_p$ (herein, $R_p$ is a resistance value when magnetization of a reference layer adjacent to a barrier layer and magnetization of a recording layer adjacent to the barrier layer are arranged in parallel; and $R_{ap}$ is a resistance value when magnetization of the reference layer adjacent to the barrier layer and the magnetization of the recording layer adjacent to the barrier layer are arranged in anti-parallel). Furthermore, the thermal stability A is a value proportional to $K_{eff}\cdot V/k_B T$ (herein, $K_{eff}$ is a value of effective magnetic anisotropy energy density of the recording layer, V is a volume of the recording layer, $k_B$ is Boltzmann's constant, and T is absolute temperature). In general, the MTJ element is suitable when the tunnel magnetoresistance ratio is larger, and also suitable when a value obtained by dividing the thermal stability by a threshold current is larger.

When the MTJ element is a perpendicular magnetization type, the direction in which the magnetization passes in the case where the magnetization is reversed by STT is the same as that in the case where thermal reversal occurs. On the other hand, when the MTJ element is an in-plane magnetization type, the direction in which the magnetization passes in the case where the magnetization is reversed by STT is different from that in the case where thermal reversal occurs. In this case, in the reversal by STT, the magnetization passes in a plane-perpendicular direction in which the demagnetization is large, and in the thermal reversal, the magnetization passes in the in-plane direction in which the demagnetization is small. As a result, in the in-plane magnetization type, the ratio of the thermal stability to the threshold current becomes smaller as compared with the perpendicular magnetization type. Therefore, recently, more attention has been paid to the perpendicular magnetization type MTJ element, and the perpendicular magnetization type MTJ element has been used.

As such a perpendicular magnetization type MTJ element, by using a ferromagnetic layer formed of CoFeB and an MgO insulating film, an element having a high tunnel magnetoresistance ratio, high thermal stability, and a low threshold current has been developed (see, for example, Patent Literature 1). Currently, investigation using this material system is actively carried out.

Furthermore, to improve the perpendicular magnetic anisotropy, an element having a structure (a double interface structure) in which a recording layer (CoFeB) is sandwiched by a barrier layer (MgO) including oxygen and a protective layer (MgO), such as an MgO (barrier layer)/CoFeB (recording layer)/MgO (protective layer) structure, has been developed (see, for example, Patent Literature 1). Furthermore, an element having a double interface structure using an electric conductive oxide layer as the protective layer, and an element in which a metal cap layer is disposed on the protective layer have been developed (see, for example, Patent Literature 2).

In the MTJ element having such a double interface structure, by two perpendicular magnetic anisotropies generated on the CoFeB/MgO interface below and above the recording layer, a film thickness of the recording layer can be made larger as compared with a tunnel junction element that does not include an MgO protective layer. Since the thermal stability is increased in proportion to the film thickness of the recording layer, by increasing the film thickness, the thermal stability can be improved. Furthermore, at the same time, by increasing the film thickness of the recording layer, a damping constant α of the recording layer can be decreased. Since a value of a writing current is proportional to α, the value of the writing current can be simultaneously decreased. As a result, the MTJ element having a double interface structure has high thermal stability, and a small writing current, that is, the MTJ element has a larger value obtained by dividing the thermal stability by the threshold current.

On the other hand, the MTJ element that does not include an MgO protective layer, a protective layer of Ta, or the like, instead of the MgO protective layer, is stacked on the recording layer. In this case, since Ta absorbs boron by heat treatment, CoFeB is crystallized, and a high TMR ratio can be achieved.

However, in the MTJ element having a double interface structure described in Patent Literature 1 or 2, since CoFeB is sandwiched by MgO, and a cap such as Ta is not provided, diffusion of boron by heat treatment is not likely to occur. Therefore, CoFeB is not crystallized by heat treatment, and the TMR ratio may be deteriorated.

Thus, in order to prevent such deterioration of the TMR ratio, an MTJ element in which a thin non-magnetic layer of Ta or the like is inserted between the recording layers has been proposed (see, for example, Non-Patent Literature 1). In this MTJ element, by heat treatment, a non-magnetic layer of Ta or the like absorbs boron to crystallize CoFeB, so that a high TMR ratio is achieved.

CITATION LIST

Patent Literatures

Patent Literature 1: JP-A-2014-207469
Patent Literature 2: WO2013/069091

Non-Patent Literatures

Non-Patent Literature 1: H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett., 2012, 101, 022414

SUMMARY OF THE INVENTION

However, in the MTJ element described in Non-Patent Literature 1, when a non-magnetic layer of Ta or the like inserted between the recording layers is heat-treated at such a high temperature as 350° C. or higher, Ta or the like diffuses into the recording layer and reaches a barrier layer to deteriorate the TMR ratio. Furthermore, as the non-magnetic layer, high melting metal having high heat resistance, such as Ta and W, is used, but these materials have large atomic weight. Accordingly, in film formation by sputtering, materials such as Ta collide with the recording layer, and the recording layer may be easily damaged.

The present invention has been made by focusing on such problems, and has an object to provide a magnetic tunnel junction element having a higher TMR ratio, and capable of preventing a recording layer from being damaged in film-formation, and a magnetic memory.

In order to achieve the above-mentioned object, a magnetic tunnel junction element of the present invention includes a reference layer including a ferromagnetic body, and having a magnetization direction fixed in a direction perpendicular to a film plane; a barrier layer including a non-magnetic body, and disposed on one surface side of the reference layer; and a recording layer disposed on a surface of the barrier layer opposite to the reference layer. The recording layer includes a first ferromagnetic layer including at least one of Co and Fe, and having a magnetization direction variable in a direction perpendicular to a film plane; a first non-magnetic layer including at least one of Mg, MgO, C, Li, Al, and Si, and disposed on one surface side of the first ferromagnetic layer; a second non-magnetic layer including at least one of Ta, Hf, W, Mo, Nb, Zr, Y, Sc, Ti, V, and Cr, disposed on a surface side of the first non-magnetic layer opposite to the first ferromagnetic layer, and having a thickness of 0.3 to 2.0 nm; and a second ferromagnetic layer including at least one of Co and Fe, having a magnetization direction variable in the direction perpendicular to a film plane, and disposed on one surface side of the second non-magnetic layer opposite to the first non-magnetic layer. The barrier layer is disposed on at least one of a surface side of the first ferromagnetic layer opposite to the first non-magnetic layer, and a surface side of the second ferromagnetic layer opposite to the second non-magnetic layer.

The magnetic tunnel junction element of the present invention includes a first non-magnetic layer including Mg, MgO, or the like, and a second non-magnetic layer including Ta or the like, which are inserted between the first ferromagnetic layer and the second ferromagnetic layer whose magnetization directions are respectively variable in the direction perpendicular to the film plane. The magnetic tunnel junction element according to the present invention can be manufactured by sputtering or the like. Since the second non-magnetic layer including Ta or the like is inserted in the magnetic tunnel junction element according to the present invention, the first ferromagnetic layer and the second ferromagnetic layer are crystallized by heat treatment at the time of manufacture, and the TMR ratio can be improved.

Furthermore, in the magnetic tunnel junction element according to the present invention, the first non-magnetic layer is formed earlier than the second non-magnetic layer. Thus, when the second non-magnetic layer is formed by sputtering or the like, the first non-magnetic layer can prevent materials such as Ta from colliding with and being driven into the first ferromagnetic layer. This makes it possible to prevent the first ferromagnetic layer from being damaged and the recording layer from being deteriorated. Furthermore, since materials such as Ta are not driven into first ferromagnetic layer, it is possible to prevent Ta or the like from diffusing into the first ferromagnetic layer by heat treatment at the time of manufacture. Thus, the TMR ratio can be prevented from being reduced. Furthermore, a temperature of the heat treatment can be increased.

The reference layer in magnetic tunnel junction element according to the present invention may be made of any material as long as it includes a ferromagnetic body. The reference layer is made of a ferromagnetic layer including at least one of Co and Fe, for example, a FePt layer, a TbFeCo layer, and the like. Furthermore, the reference layer may have any thicknesses. However, if perpendicular magnetization caused by interface magnetic anisotropy is used, the thickness is preferably 5 nm or less, more preferably 3 nm or less, and further more preferably 1.6 nm or less.

The barrier layer may be made of any materials as long as it includes oxygen, and is capable of producing magnetic tunnel junction between the reference layer and the recording layer. The barrier layer is made of, for example, MgO, MgOTi, MgOTiN, $Al_2O_3$, $SiO_2$, MgZnO, and the like. The barrier layer may have any thicknesses as long as the magnetic tunnel junction can be produced, but the thickness is preferably 10 nm or less, and particularly preferably 5 nm or less.

The first ferromagnetic layer and the second ferromagnetic layer may include at least one of Co and Fe, respectively, and preferably include at least one of Co, Fe, CoB, and FeB. The first ferromagnetic layer and the second ferromagnetic layer may be a layer including, for example, CoFeB, CoFeBM (herein, M is at least one including Ni, Zr, Hf, Ta, Mo, Nb, Pt, Cr, Si, and V), and the like. Furthermore, a small amount of other elements may be included. Furthermore, the first ferromagnetic layer and the second ferromagnetic layer may be a single layer, or a stacked film including a plurality of films. For example, it may be a stacked film composed of a layer including Fe, and a layer including FeB or CoB.

The first ferromagnetic layer and the second ferromagnetic layer may have any thicknesses. However, if perpendicular magnetization caused by interface magnetic anisotropy is used, the thickness is preferably 5 nm or less, more preferably 3 nm or less, and further more preferably 1.6 nm or less, respectively. The thickness of the first ferromagnetic layer is particularly preferably 0.5 nm to 4 nm. The thickness of the second ferromagnetic layer is particularly preferably 0.5 nm to 4 nm. Furthermore, the first ferromagnetic layer and the second ferromagnetic layer preferably have a thickness of 2 nm or more in total. Furthermore, the second non-magnetic layer preferably has thickness of 0.4 to 0.5 nm. In this case, the magnetic coupling between the first ferromagnetic layer and the second ferromagnetic layer is not deteriorated, and the TMR ratio can be enhanced.

It is preferable that the magnetic tunnel junction element according to the present invention includes a protective layer including a non-magnetic body and disposed on a surface side of the recording layer opposite to the barrier layer. In this case, a double interface structure in which the recording layer is sandwiched between the barrier layer and the protective layer can be achieved. The protective layer is preferably made of a non-magnetic body containing oxygen, and is made of, for example, MgO, MgOTi, MgOTiN, $Al_2O_3$, $SiO_2$, MgZnO, and the like. In this case, by sandwiching the recording layer between the barrier layer and the protective layer, which both include oxygen, perpendicular magnetic anisotropy can be generated at the interface between the barrier layer and the recording layer, and the interface between the protective layer and the recording layer, respectively. Thus, the film thickness of the recording layer can be increased, and the thermal stability can be improved. The protective layer may have any thicknesses, but the thickness is preferably 10 nm or less, and particularly preferably 5 nm or less. Furthermore, the thickness of the protective layer is preferably the same as or not more than the thickness of the barrier layer.

In the magnetic tunnel junction element according to the present invention, the first ferromagnetic layer and the second ferromagnetic layer are brought into contact with the barrier layer or the protective layer, respectively, and have a magnetization direction being preferably perpendicular to a film plane by interface perpendicular magnetic anisotropy of the barrier layer or the protective layer in contact. In this case, by increasing the film thickness of the recording layer, the thermal stability can be enhanced. Note here that any one of the first ferromagnetic layer and the second ferromagnetic layer may be brought into contact with the barrier layer, and the other one may be brought into contact with the protective layer, or both of the first ferromagnetic layer and the second ferromagnetic layer may be brought into contact with the barrier layer.

In the magnetic tunnel junction element according to the present invention, it is preferable that the first non-magnetic layer has a thickness of preferably 0.1 to 1.0 nm, and particularly preferably 0.1 to 0.4 nm. In this case, the magnetic coupling between the first ferromagnetic layer and the second ferromagnetic layer is not deteriorated, and the TMR ratio can be enhanced.

It is preferable that the magnetic tunnel junction element according to the present invention includes a base layer for forming at least the reference layer, the barrier layer, and the recording layer on one surface side, and that in the recording layer, the first non-magnetic layer is disposed closer to the base layer than the second non-magnetic layer. In this case, the magnetic tunnel junction element according to the present invention can be manufactured by forming the reference layer, the barrier layer, and the recording layer on one surface side of the base layer by sputtering or the like. In the magnetic tunnel junction element according to the present invention, since the first non-magnetic layer is disposed closer to the base layer than the second non-magnetic layer, when the second non-magnetic layer is formed, it is possible to prevent the first ferromagnetic layer from being damaged, or the TMR ratio being deteriorated due to diffusion of Ta or the like. Therefore, in the magnetic tunnel junction element according to the present invention, the recording layer is not damaged, and the TMR ratio is high.

In the magnetic tunnel junction element according to the present invention, it is preferable that the first ferromagnetic layer and the second ferromagnetic layer are magnetically coupled to each other via the first non-magnetic layer and the second non-magnetic layer. In this case, the first non-magnetic layer and the second non-magnetic layer have preferably a thickness that does not deteriorate the magnetic coupling to the first ferromagnetic layer and the second ferromagnetic layer, respectively. Note here that since Mg, MgO, or the like included in the first non-magnetic layer has a small atomic radius and high volatility, the magnetic coupling between the first ferromagnetic layer and the second ferromagnetic layer via the second non-magnetic layer is not easily deteriorated.

A magnetic memory in the present invention includes a plurality of source lines disposed in parallel to each other; a plurality of word lines disposed in parallel to each other in a direction crossing the source lines; a plurality of bit lines disposed in parallel to the source lines; a selection transistor including a gate electrode electrically connected to any one of the word lines, and a source electrode electrically connected to any one of the source lines; and a magnetic tunnel junction element according to the present invention, in which any one of the first ferromagnetic layer and the second ferromagnetic layer is electrically connected to a drain electrode of the selection transistor, and the other of them is electrically connected to any one of the bit lines, wherein a current can be applied in a direction perpendicular to a film plane of the magnetic tunnel junction element.

It is preferable that the magnetic memory in the present invention includes a plurality of storage cells each including the selection transistor and the magnetic tunnel junction element and having different combinations of a word line, a bit line, and a source line, which are electrically connected one another; a writing unit configured to select any one of the storage cells and to write data in the selected storage cell via each word line, each bit line, and each source line; and a read-out unit configured to select any one of the storage cells and to read out data from the selected storage cell via each word line, each bit line, and each source line.

The magnetic memory in the present invention includes the magnetic tunnel junction element according to the present invention, and therefore thermal stability is high. In particular, use of a magnetic tunnel junction element excellent in perpendicular magnetic anisotropy can increase density and reduce power consumption.

The present invention can provide a magnetic tunnel junction element that has a high TMR ratio, and that can prevent a recording layer from being damaged in film formation, and a magnetic memory.

DETAILED DESCRIPTION OF THE INVENTION

Hereinafter, embodiments of the present invention will be described with reference to the drawings.

FIGS. 1 to 5 show a magnetic tunnel junction (MTJ) element 10 in an embodiment of the present invention.

Figure 1:
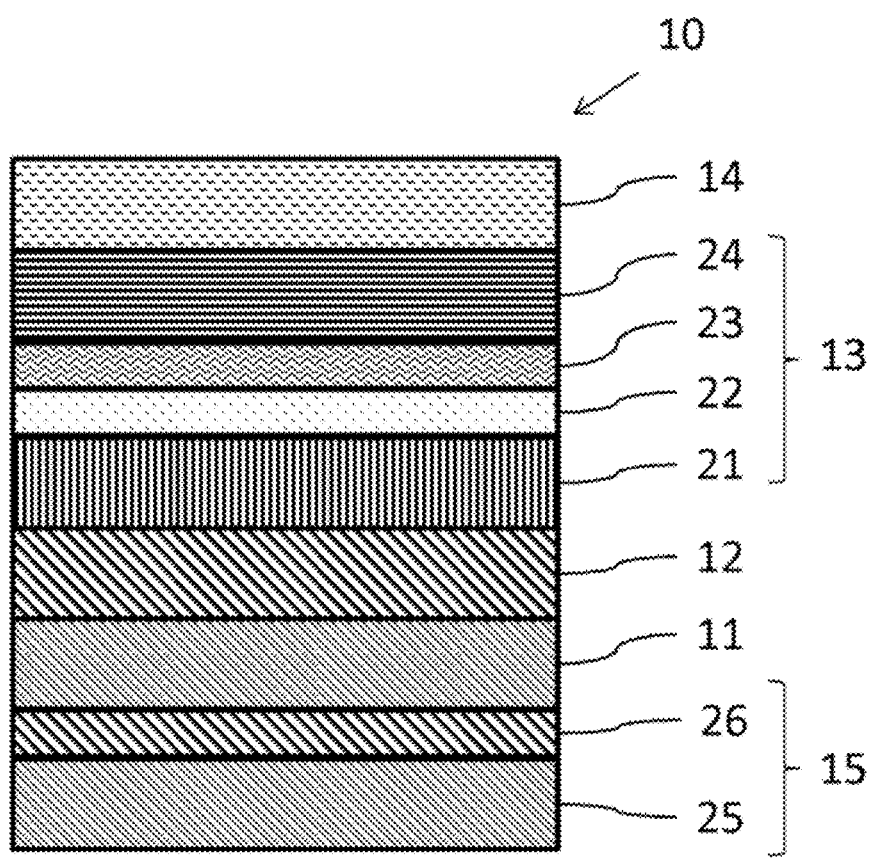
FIG. 1 is a sectional view showing a magnetic tunnel junction element in an embodiment of the present invention.
Figure 2:
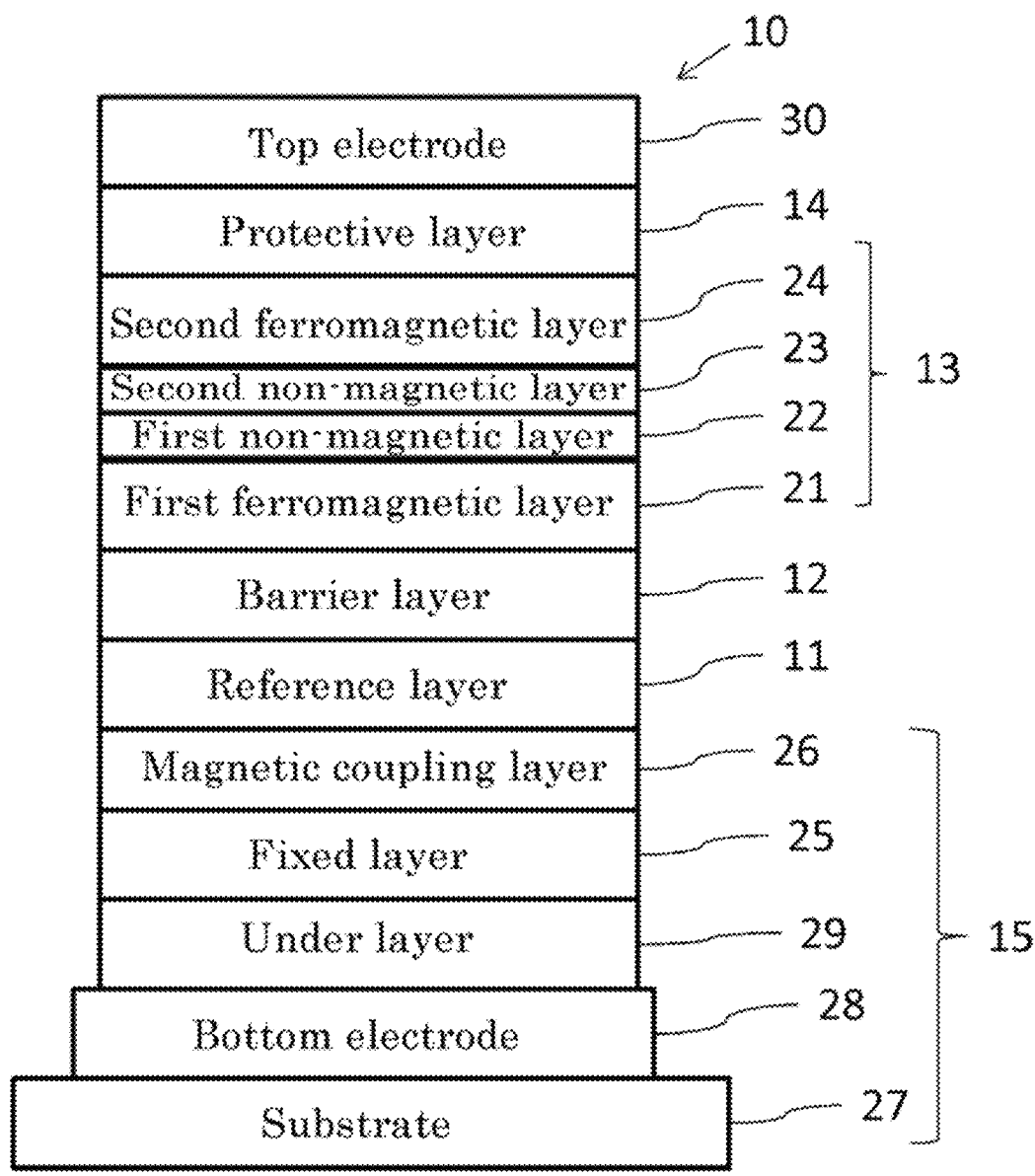
FIG. 2 is a sectional view showing one example of an actual structure of a magnetic tunnel junction element in an embodiment of the present invention.
Figure 3:
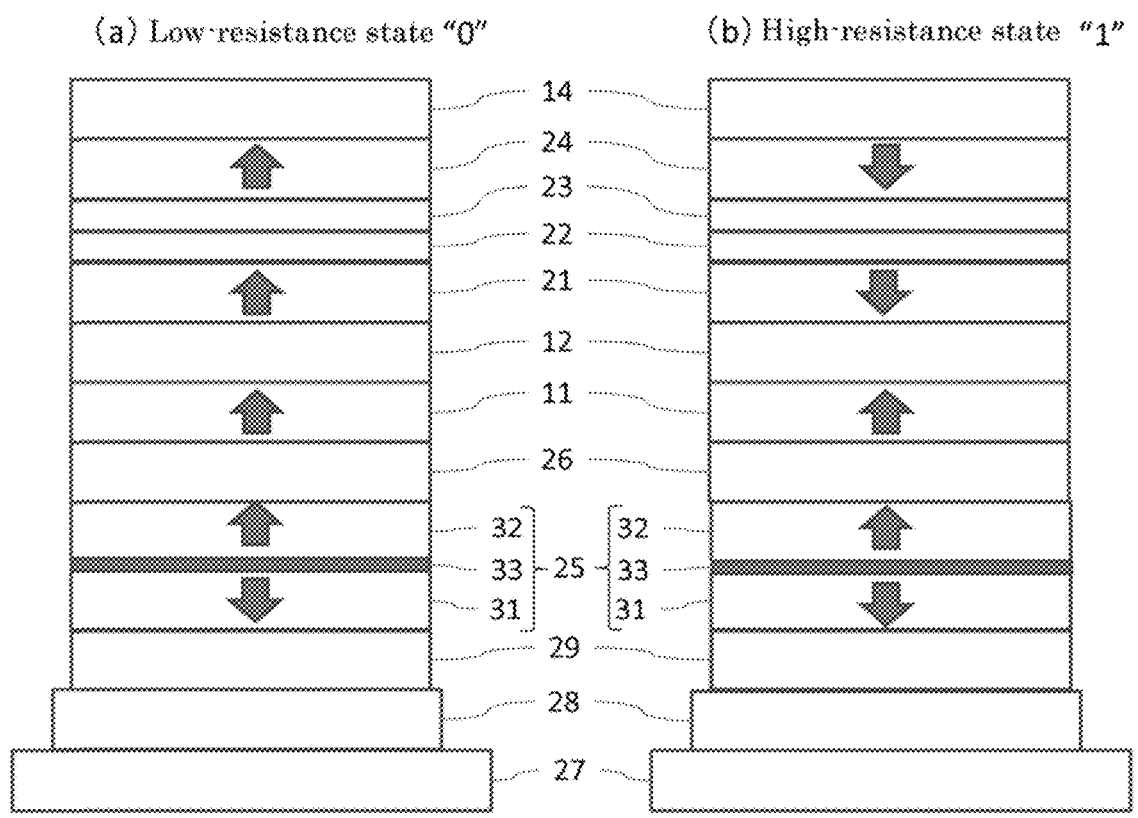
FIG. 3 is a view illustrating (a) a low-resistance state and (b) a high-resistance state of the magnetic tunnel junction element in an embodiment of the present invention.

As shown in FIGS. 1 to 3, a magnetic tunnel junction element 10 has a structure in which a reference layer 11, a barrier layer 12, a recording layer 13, and a protective layer 14 are stacked in this order, and includes a base layer 15 for forming each of these layers by sputtering or the like.

The reference layer 11 is made of a ferromagnetic body, and has a magnetization direction fixed in a direction perpendicular to a film plane. The reference layer 11 includes, for example, a CoFeB layer having a thickness of 1.0 to 1.2 nm.

The barrier layer 12 is made of a non-magnetic body. The barrier layer 12 includes, for example, an MgO layer having a thickness of 1.0 to 1.3 nm.

The recording layer 13 has a structure in which a first ferromagnetic layer 21, a first non-magnetic layer 22, a second non-magnetic layer 23, and a second ferromagnetic layer 24 are stacked in this order. The first ferromagnetic layer 21 has a magnetization direction variable in the direction perpendicular to a film plane, and is made of, for example, CoFeB having a thickness of 1.4 to 1.5 nm. The first non-magnetic layer 22 is made of, for example, MgO or Mg having a thickness of 0.1 to 1.0 nm. The second non-magnetic layer 23 is made of, for example, Ta or W having a thickness of 0.3 to 0.5 nm. The second ferromagnetic layer 24 has a magnetization direction variable in the direction perpendicular to a film plane, and is made of, for example, CoFeB having a thickness of 1.0 to 1.5 nm.

The first ferromagnetic layer 21 and the second ferromagnetic layer 24 are magnetically coupled to each other via the first non-magnetic layer 22 and the second non-magnetic layer 23. The barrier layer 12 may be disposed on any one side of a first ferromagnetic layer 21 side and a second ferromagnetic layer 24 side of the recording layer 13. In one specific example shown in FIG. 1, the barrier layer 12 is disposed on the first ferromagnetic layer 21 side.

The protective layer 14 is made of a non-magnetic body including oxygen. The protective layer 14 includes, for example, an MgO layer having a thickness of 1.0 to 1.1 nm. Note here that the protective layer 14 may include an electroconductive oxide film. Examples of the electroconductive oxide film include (1) rutile-$MoO_2$ type oxide such as $RuO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$, and $Ti_3O_5$, (2) NaCl type oxide such as TiO, VO, NbO, LaO, NdO, SmO, EuO, SrO, BaO, and NiO, (3) spinel-type oxide such as $LiTi_2O_4$, $LiV_2O_4$, and $Fe_3O_4$, (4) perovskite $ReO_3$ type oxide such as $ReO_3$, $CaCrO_3$, $SrCrO_3$, $BaMoO_3$, $SrMoO_3$, $CaMoO_3$, $LaCuO_3$, $CaRuO_3$, $SrVO_3$, and $BaTiO_3$, (5) corundum oxide such as $Ti_2O_3$, $V_2O_3$, and $Rh_2O_3$, (6) oxide semiconductor such as ZnO, $TiO_2$, $SnO_2$, $Cu_2O$, $Ag_2O$, $In_2O_3$, and $WO_3$, (7) $TaO_2$, or the like.

In one example shown in FIG. 1, a fixed layer 25 and a magnetic coupling layer 26 are included as a base layer 15. Furthermore, the base layer 15 is disposed on a surface of the reference layer 11 opposite to the barrier layer 12 such that the first non-magnetic layer 22 is closer to the base layer 15 than the second non-magnetic layer 23. As shown in FIG. 3, the fixed layer 25 includes a third ferromagnetic layer 31, a fourth ferromagnetic layer 32, and a third non-magnetic layer 33 sandwiched therebetween. The third ferromagnetic layer 31 includes, for example, a film in which a Co film having a thickness of 0.5 nm and a Pt film having a thickness of 0.3 nm are alternately stacked four times. The fourth ferromagnetic layer 32 includes, for example, a film in which a Co film having a thickness of 0.5 nm and a Pt film having a thickness of 0.3 nm are alternately stacked twice. The third non-magnetic layer 33 includes, for example, a film in which a Ru film having a thickness of 0.9 nm and a Co film having a thickness of 0.5 nm are stacked. In the fixed layer 25, magnetization directions of the third ferromagnetic layer 31 and the fourth ferromagnetic layer 32 are opposite to each other via the third non-magnetic layer 33 in a direction perpendicular to a film plane by RKKY interaction.

The magnetic coupling layer 26 is made of a non-magnetic body, and sandwiched between the fixed layer 25 and the reference layer 11. The magnetic coupling layer 26 includes, for example, a film in which a Co film having a thickness of 0.5 nm and a Ta film having a thickness of 0.4 nm are stacked, or a Ta film having a thickness of 0.4 nm. The fixed layer 25 is provided such that the fourth ferromagnetic layer 32 is brought into contact with the magnetic coupling layer 26. Note here that the reference layer 11 is magnetically coupled to fixed layer 25 via the magnetic coupling layer 26, and the magnetization directions thereof are fixed in one direction in the direction perpendicular to the film plane.

In the magnetic tunnel junction element 10, a magnetic tunnel junction is generated between the reference layer 11 and the recording layer 13 via the barrier layer 12. Furthermore, as shown in FIG. 1, the magnetic tunnel junction element 10 has a double interface structure in which the recording layer 13 is sandwiched between the barrier layer 12 and the protective layer 14. The first ferromagnetic layer 21 is brought into contact with the barrier layer 12, and the second ferromagnetic layer 24 is brought into contact with the protective layer 14. Thus, in the magnetic tunnel junction element 10, perpendicular magnetic anisotropy is generated at the interface between first ferromagnetic layer 21 and the barrier layer 12, and at the interface between the second ferromagnetic layer 24 and the protective layer 14, respectively. The magnetization directions of the first ferromagnetic layer 21 and the second ferromagnetic layer 24 are perpendicular to the film plane. Furthermore, in the magnetic tunnel junction element 10, magnetization directions of the first ferromagnetic layer 21 and the second ferromagnetic layer 24 are changed by spin injection magnetization reversal.

The magnetic tunnel junction element 10 can be manufactured by forming the reference layer 11, the barrier layer 12, the first ferromagnetic layer 21, the first non-magnetic layer 22, the second non-magnetic layer 23, the second ferromagnetic layer 24, and the protective layer 14 on the base layer 15, and then heat-treating thereof. As a method for depositing each layer, sputtering or a molecular beam epitaxial method (MBE method), which are physical vapor deposition methods, or the like can be used. The temperature for heat treatment is preferably 350° C. to 450° C.

The magnetic tunnel junction element 10, as shown in FIG. 2, for example, actually has a configuration in which a bottom electrode layer 28 and an under layer 29 are formed on a substrate 27, and the fixed layer 25, the magnetic coupling layer 26, the reference layer 11, the barrier layer 12, the first ferromagnetic layer 21, the first non-magnetic layer 22, the second non-magnetic layer 23, the second ferromagnetic layer 24, the protective layer 14, and a top electrode layer 30 are stacked in this order, on the under layer 29. Also, in this case, the magnetic tunnel junction element 10 can be manufactured by forming each layer on the substrate 27, and then heat-treating thereof. Note here that in one example shown in FIG. 2, the substrate 27, the bottom electrode layer 28, the under layer 29, the fixed layer 25, and the magnetic coupling layer 26 constitute the base layer 15.

The substrate 27 has a configuration including a transistor and a plurality of wiring layers.

The bottom electrode layer 28 includes, for example, a conductive layer having a thickness of about 20 to 50 nm. The bottom electrode layer 28 is made of metal materials such as Ta, TaN, Ti, TiN, Cu, CuN, Au, Ag, and Ru, an alloy thereof, and the like. Furthermore, the bottom electrode layer 28 may have a structure in which a plurality of metal materials are stacked, for example, a structure of Ta/Ru/Ta. The bottom electrode layer 28 is a layer as a base for forming each layer above. After film formation, the surface is made flat by chemical mechanical polishing (CMP), gas cluster ion beam (GCIB), or the like.

The under layer 29 includes, for example, a Ta layer having a thickness of about 5 nm. The under layer 29 may be made of, in addition to Ta, metal materials such as Pt, Cu, CuN, Au, Ag, Ru, and Hf, an alloy thereof, and the like.

Furthermore, the under layer 29 may have a structure in which a plurality of metal materials is stacked, for example, a structure of Ta/Pt.

The top electrode layer 30 includes, for example, a conductive layer having a thickness of about 10 to 100 nm. The top electrode layer 30 is made of metal materials such as Ta, TaN, Ti, TiN, Cu, CuN, Au, Ag, and Ru, an alloy thereof, and the like. Furthermore, the top electrode layer 30 may have a structure in which a plurality of metal materials is stacked, for example, a structure of Ta/Ru.

Next, the operation is described.

In the magnetic tunnel junction element 10, since the second non-magnetic layer 23 including Ta or W is inserted between the first ferromagnetic layer 21 and the second ferromagnetic layer 24, by heat treatment at the time of manufacture, the second non-magnetic layer 23 absorbs B included in the first ferromagnetic layer 21 and the second ferromagnetic layer 24. Thus, crystallization of the first ferromagnetic layer 21 and the second ferromagnetic layer 24 can be promoted, and the TMR ratio can be enhanced.

Furthermore, in manufacturing the magnetic tunnel junction element 10, since the first non-magnetic layer 22 is formed earlier than the second non-magnetic layer 23, when the second non-magnetic layer 23 is formed by sputtering or the like, the first non-magnetic layer 22 can prevent Ta or W from colliding with and being driven into the first ferromagnetic layer 21. This makes it possible to prevent the first ferromagnetic layer 21 from being damaged and the recording layer 13 from being damaged. Furthermore, since Ta or W is not driven into the first ferromagnetic layer 21, it is possible to prevent Ta or W from diffusing into the first ferromagnetic layer 21 by heat treatment at the time of manufacture. Thus, the TMR ratio can be prevented from being reduced. Furthermore, the temperature of heat treatment can be increased. In this way, in the magnetic tunnel junction element 10, the recording layer 13 is not damaged, and the TMR ratio is high.

Furthermore, the magnetic tunnel junction element 10 has a double interface structure, and the perpendicular magnetic anisotropy is generated on two interfaces of the recording layer 13, respectively. Therefore, a film thickness of the recording layer 13 can be increased, and the thermal stability can be enhanced. Furthermore, as the first non-magnetic layer 22 is made of Mg or MgO, having a small atomic radius and high volatility, magnetic coupling between the first ferromagnetic layer 21 and the second ferromagnetic layer 24 via the second non-magnetic layer 23 is not likely to be deteriorated.

In the magnetic tunnel junction element 10, as shown in FIG. 3(a), when the magnetization direction of the reference layer 11 and the magnetization direction of the recording layer 13 are in parallel to each other in the same direction (P-state), resistance between the bottom electrode layer 28 and the top electrode layer 30 becomes low. On the other hand, as shown in FIG. 3(b), when the magnetization direction of the reference layer 11 and the magnetization direction of the recording layer 13 are in anti-parallel (in parallel in the opposite direction: AP-state), the resistance between the bottom electrode layer 28 and the top electrode layer 30 becomes high. By allowing the low and high of the resistance value to correspond to bit information "0" and "1", information can be written. In one example shown in FIG. 3, "0" is allocated to the low resistance, and "1" is allocated to the high resistance.

When information is to be written into the magnetic tunnel junction element 10, by changing the direction of a writing current that is allowed to flow between the bottom electrode layer 28 and the top electrode layer 30, "0" or "1" can be written. When the writing current is allowed to flow from the top electrode layer 30 to the bottom electrode layer 28, as shown in FIG. 3(a), the magnetization of the recording layer 13 becomes the same direction as the magnetization of reference layer 11, and "0" is written. Meanwhile, when the writing current is allowed to flow from the bottom electrode layer 28 to the top electrode layer 30, as shown in FIG. 3(b), the magnetization of the recording layer 13 becomes opposite direction to the magnetization of reference layer 11, and "1" is written.

When information is read out from magnetic tunnel junction element 10, a read-out voltage is applied between the bottom electrode layer 28 and the top electrode layer 30, and a current corresponding to each of the resistance values of "0" or "1" flows. By detecting the current, written information can be read out.

Figure 4:
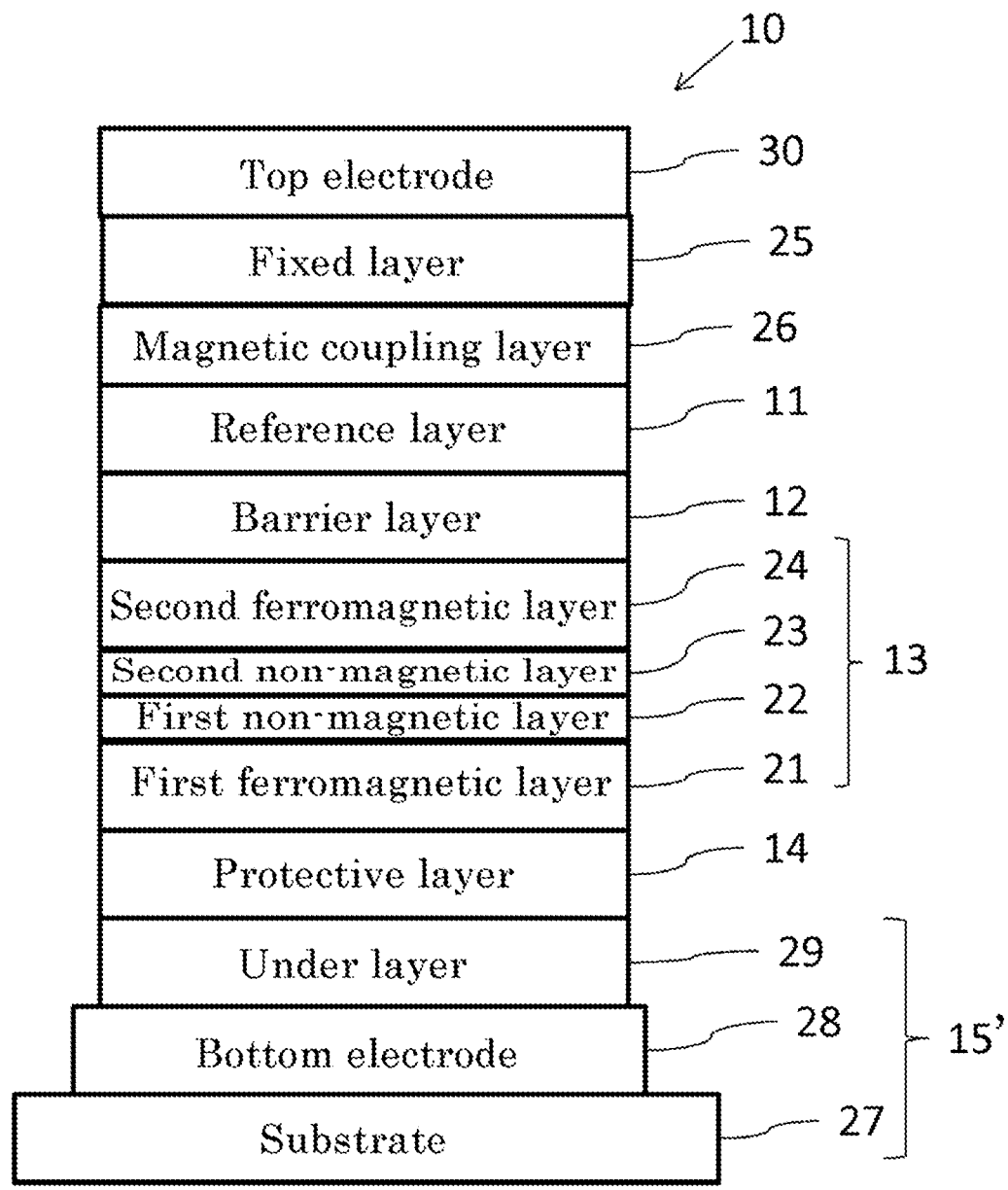
FIG. 4 is a sectional view showing a magnetic tunnel junction element of a first modification example in an embodiment of the present invention.

Note here that as shown in FIG. 4, the magnetic tunnel junction element 10 may have a configuration in which layers from the fixed layer 25 to the protective layer 14 are upside down. In this case, the under layer 29 is brought into contact with the protective layer 14, and the fixed layer 25 is brought into contact with the top electrode layer 30. Furthermore, the substrate 27, the bottom electrode layer 28, and the under layer 29 constitute the base layer 15'. The recording layer 13 has a configuration in which the first ferromagnetic layer 21, the first non-magnetic layer 22, the second non-magnetic layer 23, and the second ferromagnetic layer 24 are stacked in this order from a protective layer 14 side to a barrier layer 12 side such that the first non-magnetic layer 22 is closer to the base layer 15' than the second non-magnetic layer 23.

Figure 5:
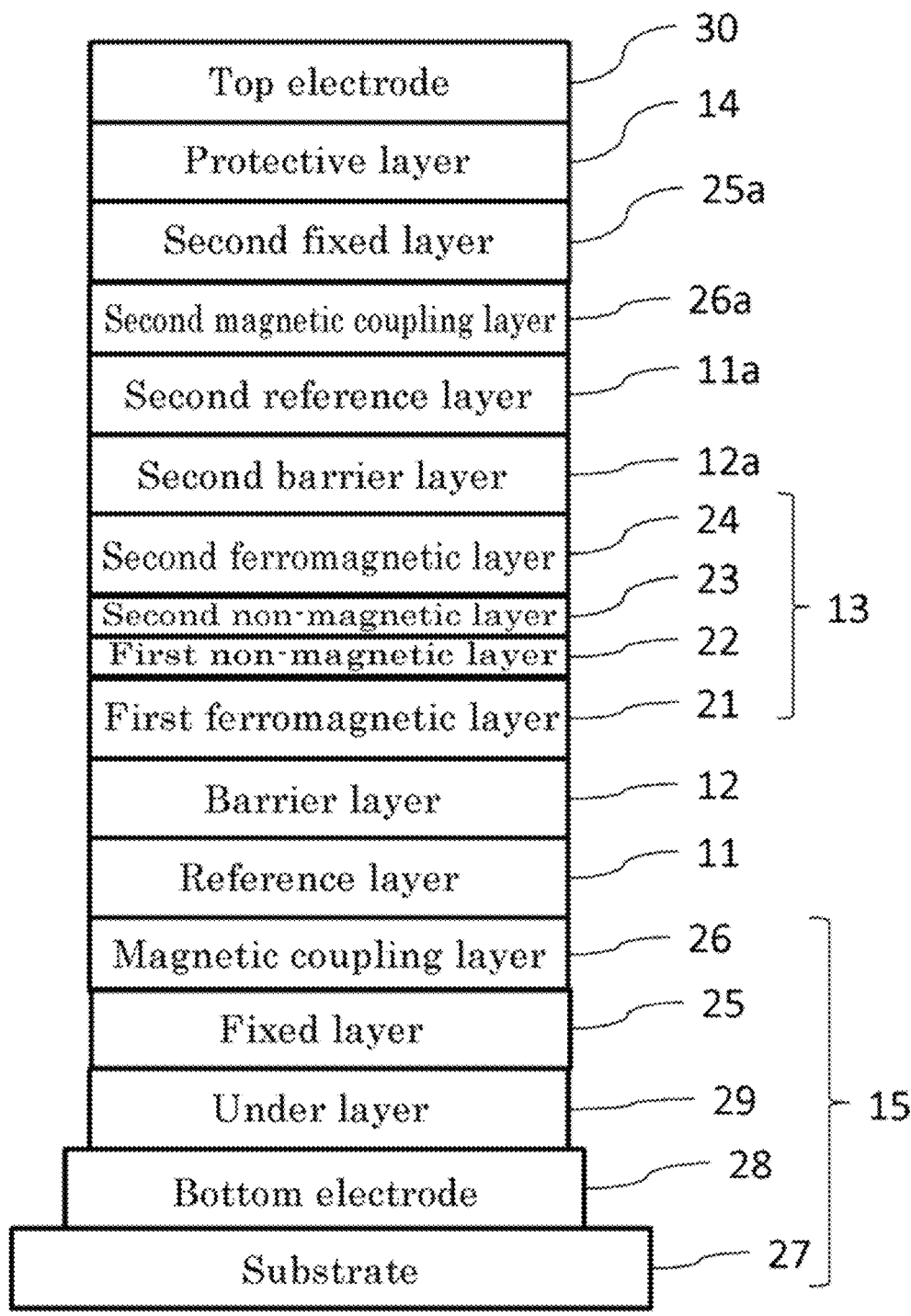
FIG. 5 is a sectional view showing a magnetic tunnel junction element of a second modification example in an embodiment of the present invention.

Furthermore, as shown in FIG. 5, the magnetic tunnel junction element 10 may have a configuration in which a second barrier layer 12a, a second reference layer 11a, a second magnetic coupling layer 26a, and a second fixed layer 25a are inserted between the recording layer 13 and the protective layer 14 and stacked in this order from the recording layer 13 side.

Figure 6:
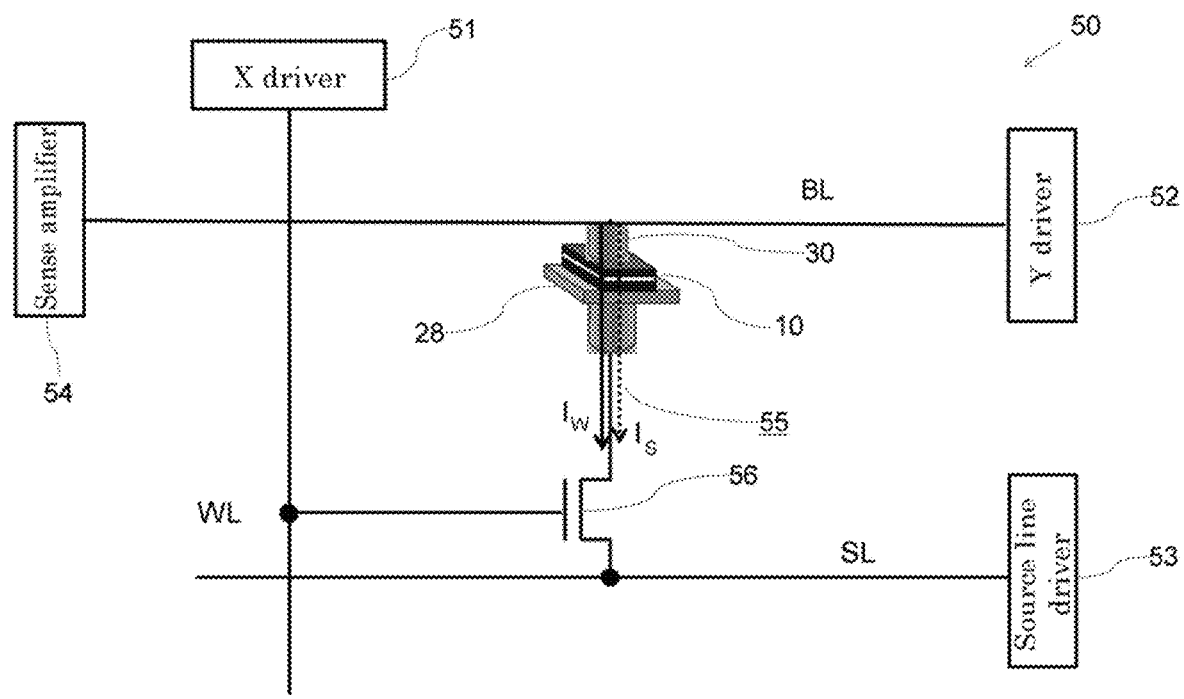
FIG. 6 is a block circuit diagram showing a magnetic memory in an embodiment of the present invention.

FIG. 6 shows a magnetic memory in an embodiment of the present invention.

As shown in FIG. 6, a magnetic memory 50 includes a source line SL, a word line WL, a bit line BL, and an X driver (word line driver) 51, a Y driver (bit line BL driver) 52, a source line driver 53, a sense amplifier 54, and a storage cell 55.

The source line SL is one of a plurality of source lines SL, and the source lines SL are disposed in parallel to each other. The word line WL is one of a plurality of word lines WL, and the word lines WL are disposed in parallel to each other in a direction perpendicular to the source lines SL. The bit line BL is one of a plurality of bit lines BL, and the bit lines BL are disposed in parallel to each source line SL. Note here that each source line SL and each word line WL, each word line WL and each bit line BL are not electrically connected to each other directly.

The X driver 51 is connected to each word line WL. The Y driver 52 is connected to each bit line BL. The source line driver 53 is connected to each source line SL. Sense amplifier 54 is connected to each bit line BL.

The storage cell 55 is one of a plurality of storage cells, wherein the storage cells are arranged in a matrix, each in a vicinity of a position in which each word line WL and each bit line BL cross each other, respectively. Each storage cell 55 can store one bit of information, respectively. Each storage cell 55 includes a selection transistor 56 and a magnetic tunnel junction element 10. In the selection transistor 56, a gate electrode is electrically connected to any one of the word lines WL, and the source electrode is electrically connected to any one of the source lines SL. In the magnetic tunnel junction element 10, the bottom electrode layer 28 is electrically connected to any one of drain electrodes of the selection transistor 56, and the top electrode layer 30 is electrically connected to any one of the bit lines BL.

Each storage cell 55 has different combinations of electrically connected word line WL, bit line BL, and source line SL. The magnetic memory 50 can apply a current in a direction perpendicular to the film plane of magnetic tunnel junction element 10 of each storage cell 55 via the bit line BL and the source line SL.

The magnetic memory 50 functions as a writing unit having a configuration in which the X driver 51, the Y driver 52, and the source line driver 53 select any one of storage cells 55 and write data into the selected storage cell 55 via each word line WL, each bit line BL, and each source line SL. Furthermore, the magnetic memory 50 functions as a read-out unit having a configuration in which the X driver 51, the sense amplifier 54, and the source line driver 53 select any one of storage cells 55 and read out data from the selected storage cell 55 via each word line WL, each bit line BL, and each source line SL.

The magnetic memory 50 is configured to write information into the magnetic tunnel junction element 10 as follows. That is, the X driver 51 controls a voltage of the word line WL connected to the magnetic tunnel junction element 10 to be written, and turns on the corresponding selection transistor 56. Next, Y driver 52 and the source line driver 53 adjust a voltage to be applied between the bit line BL and the source line SL connected to the magnetic tunnel junction element 10 to be written, and controls the direction and size of a writing current Iw flowing in the magnetic tunnel junction element 10. Thus, desired information ("0" or "1") can be written in a spin injection magnetization reversal.

On the other hand, the magnetic memory 50 is configured to read out information from the magnetic tunnel junction element 10 as follows. That is, the X driver 51 applies a selection voltage to the word line WL, and turns on a selection transistor 56 connected to the magnetic tunnel junction element 10 to be read out. Next, the Y driver 52 and the source line driver 53 apply a read-out voltage between the bit line BL and the source line SL connected to the magnetic tunnel junction element 10 to be read out. Thus, a current corresponding to the resistance value of the written information ("0" or "1") corresponding to the resistance value flows in the magnetic tunnel junction element 10. Sense amplifier 54 converts the electric current into a voltage, and can read out written information.

Since the magnetic memory 50 includes magnetic tunnel junction element 10 having excellent perpendicular magnetic anisotropy, it has high thermal stability, high density, and small power consumption.

Example 1

Figure 7:
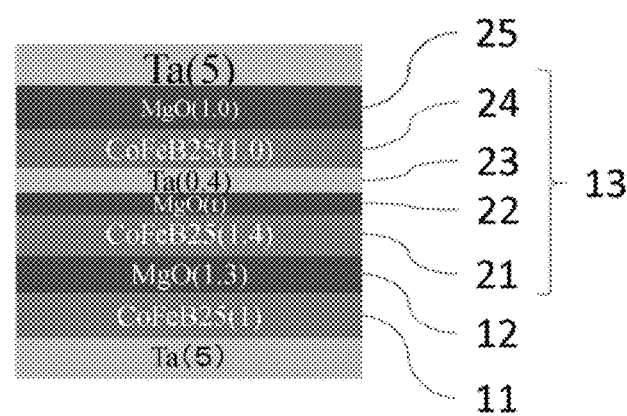
FIG. 7 is a sectional view showing a configuration used for first measurement of a magnetic tunnel junction element in an embodiment of the present invention.

The magnetic property of a magnetic tunnel junction element 10 was measured with a thickness of a first non-magnetic layer 22 varied. As shown in FIG. 7, in the magnetic tunnel junction element 10 used for the measurement, a reference layer 11 has a thickness of 1 nm and is made of CoFeB, a barrier layer 12 has a thickness of 1.3 nm and is made of MgO, a first ferromagnetic layer 21 has a thickness of 1.4 nm and is made of CoFeB, the first non-magnetic layer 22 is made of MgO, a second non-magnetic layer 23 has a thickness of 0.4 nm and is made of Ta, a second ferromagnetic layer 24 has a thickness of 1.0 nm and is made of CoFeB, and a protective layer 14 has a thickness of 1.0 nm and is made of MgO. Furthermore, on a surface of the reference layer 11 opposite to the barrier layer 12, and on a surface of the protective layer 14 opposite to a second ferromagnetic layer 24, an electrode including a Ta layer having a thickness of 5 nm is formed, respectively. Note here that each layer of magnetic tunnel junction element 10 shown in FIG. 7 is manufactured by forming each layer followed by heat treatment at 350° C. for two hours.

Figure 8:
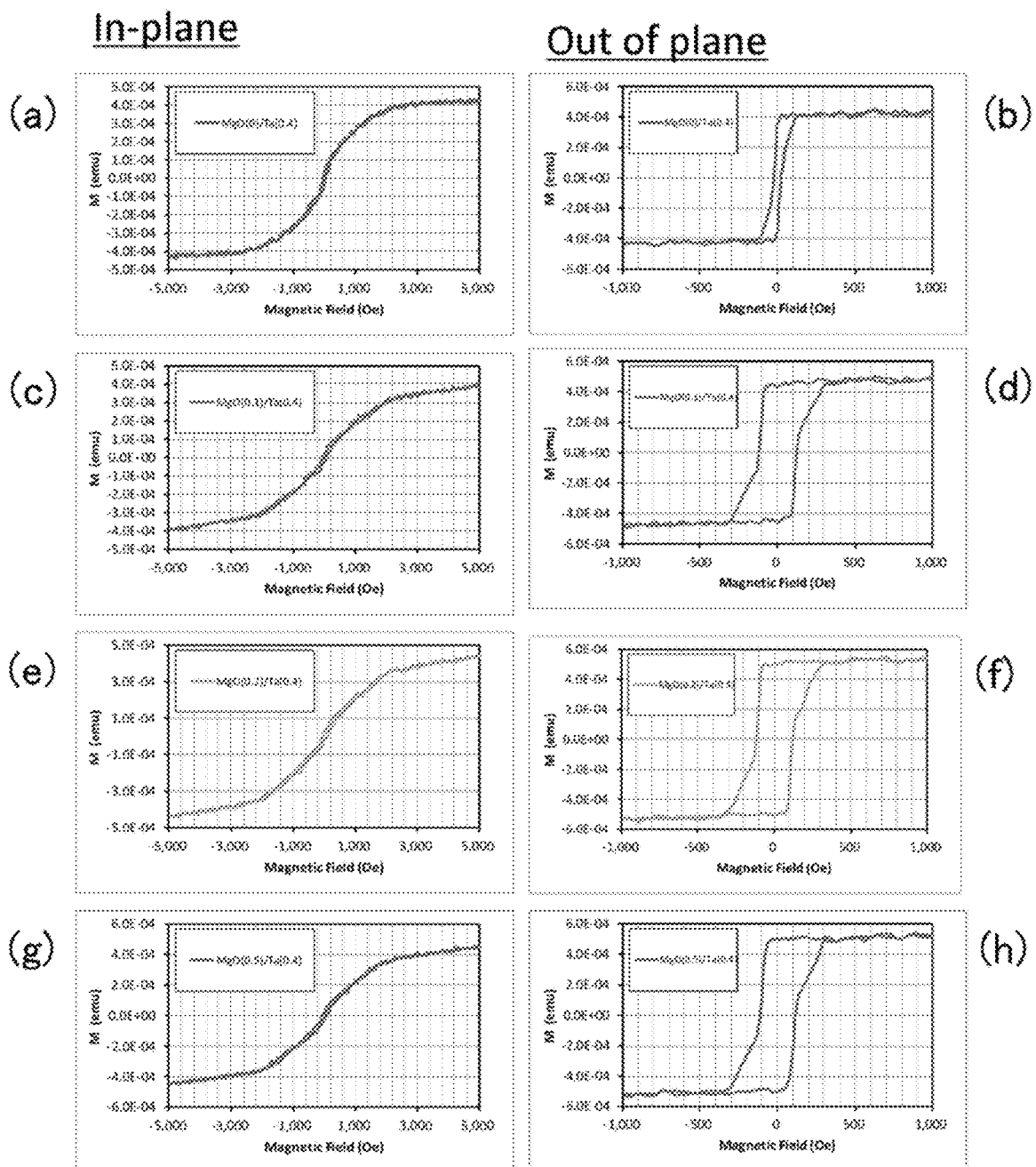
FIG. 8 is graphs showing magnetization curves of magnetic tunnel junction element shown in FIG. 7, showing (a) an in-plane direction (In-plane) and (b) a vertical direction (Out-of-plane), when a thickness of a first non-magnetic layer (MgO) is 0 nm; (c) an in-plane direction and (d) a vertical direction, when the thickness is 0.1 nm; (e) an in-plane direction and (f) a vertical direction, when the thickness is 0.2 nm; and (g) an in-plane direction and (h) a vertical direction, when the thickness is 0.5 nm.

Magnetic properties were measured with a thickness of the first non-magnetic layer (MgO) 22 varied to 0 nm (the first non-magnetic layer 22 was not included), 0.1 nm, 0.2 nm, and 0.5 nm, respectively. The measured magnetization curves are shown in FIG. 8. As shown in FIGS. 8(a), (c), (e), and (g), in an in-plane direction (In-plane) of each layer, it was demonstrated that the magnetization curve was substantially linear around the magnetic field strength of 0 Oe. Furthermore, as shown in FIGS. 8(b), (d), (f), and (h), in a direction perpendicular to the plane (Out-of-plane) of each layer, it was demonstrated that a magnetization curve was non-linear and had a hysteresis curve. This shows that the easy magnetization axis is perpendicularly oriented with respect to the plane of each layer, and the perpendicular magnetic property is obtained.

As shown in FIG. 8, it was demonstrated that when MgO of the first non-magnetic layer 22 was inserted, the coercive force $H_c$ and saturation magnetization $M_s$ were increased. This shows that insertion of MgO of the first non-magnetic layer 22 enhances the thermal stability and improves the perpendicular magnetic anisotropy.

Example 2

Figure 9:
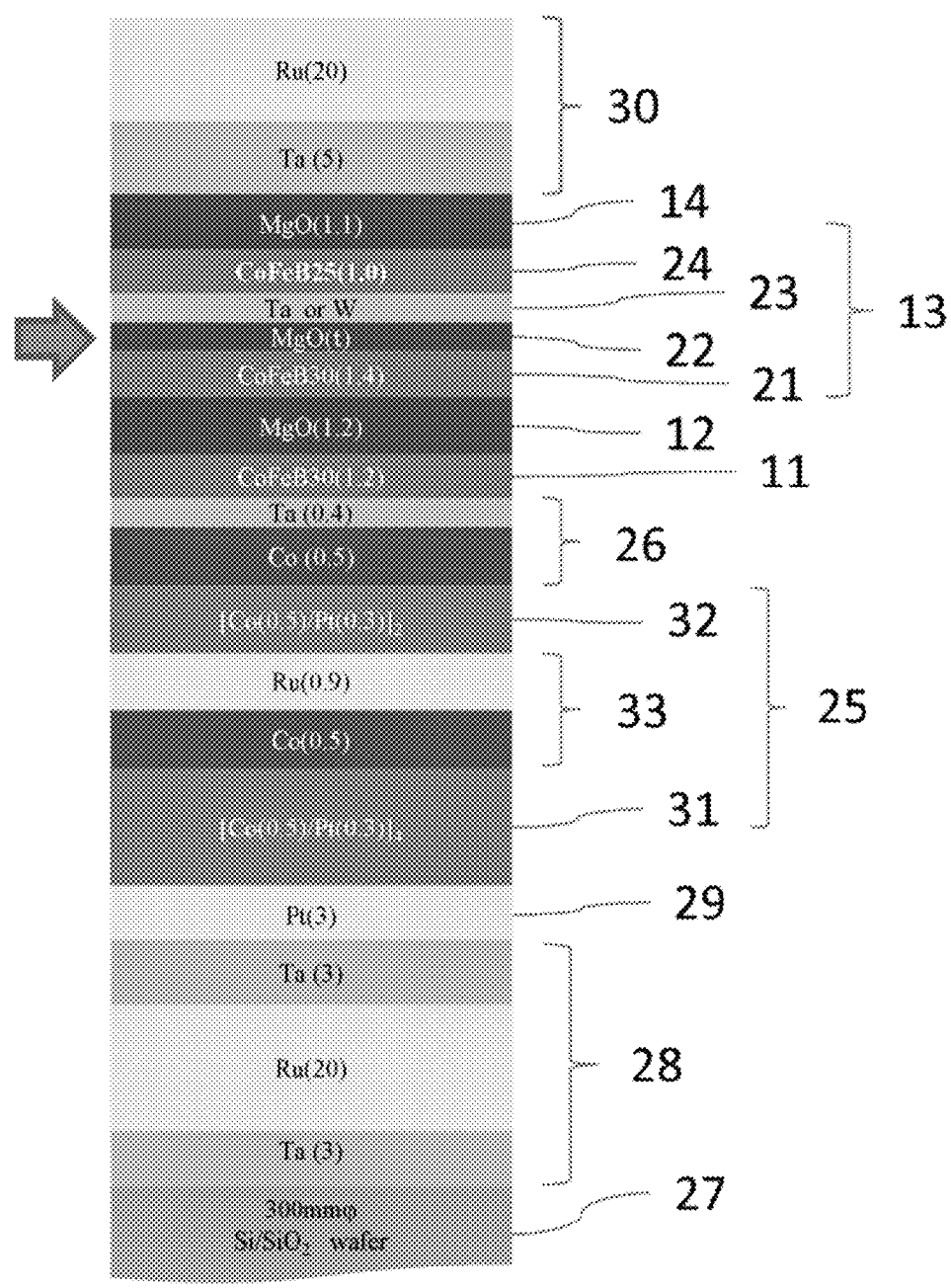
FIG. 9 is a sectional view showing a configuration used for second measurement of a magnetic tunnel junction element in an embodiment of the present invention.

The magnetic property of the magnetic tunnel junction element 10 was measured with a thickness of a first non-magnetic layer 22 made of MgO and material and thickness of a second non-magnetic layer 23 varied. As shown in FIG. 9, the magnetic tunnel junction element 10 used for the measurement has a configuration in which a bottom electrode layer 28 including a Ta film having a thickness of 3 nm, a Ru film having a thickness of 20 nm, and a Ta film having a thickness of 3 nm, an under layer 29 having a thickness of 3 nm and made of Pt, a third ferromagnetic layer 31 formed by stacking a Co film having a thickness of 0.5 nm and a Pt film having a thickness of 0.3 nm four times, a third non-magnetic layer 33 formed by stacking a Co film having a thickness of 0.5 nm and a Ru film having a thickness of 0.9 nm, a fourth ferromagnetic layer 32 formed by staking a Co film having a thickness of 0.5 nm and a Pt film having a thickness of 0.3 nm twice, a magnetic coupling layer 26 formed by stacking a Co film having a thickness of 0.5 nm and a Ta film having a thickness of 0.4 nm, a reference layer 11 having a thickness of 1.2 nm and made of CoFeB, a barrier layer 12 having a thickness of 1.2 nm and made of MgO, a first ferromagnetic layer 21 having a thickness of 1.4 nm and made of CoFeB, a first non-magnetic layer 22 made of MgO, a second non-magnetic layer 23, a second ferromagnetic layer 24 having a thickness of 1.0 nm and made of CoFeB, a protective layer 14 having a thickness of 1.1 nm and made of MgO, a top electrode layer 30 including a Ta film having a thickness of 5 nm and a Ru film having a thickness of thickness 20 nm are stacked in this order on a Si/SiO$_2$ substrate 27 having a diameter of 300 mm. Note here that the magnetic tunnel junction element 10 shown in FIG. 9 is manufactured by forming each layer followed by heat treatment at 400° C. for one hour.

The relationship between a TMR ratio and a film thickness of the first non-magnetic layer (MgO) 22 (0 nm to 0.4 nm) respectively measured in the case where the second non-magnetic layer 23 is made of Ta and has a thickness of 0.3 nm, 0.4 nm, and 0.5 nm, and the case where the second non-magnetic layer 23 is made of W and has a thickness of 0.4 nm are shown in FIG. 10(a) and Table 1.

TABLE 1

|  | MgO insertion film thickness (nm) | | | | |
| --- | --- | --- | --- | --- | --- |
|  | 0 | 0.1 | 0.2 | 0.3 | 0.4 |
| Ta insertion film thickness 0.3 nm | — | — | 60% | — | — |
| Ta insertion film thickness 0.4 nm | 130% | 142% | 150% | 165% | 170% |
| Ta insertion film thickness 0.5 nm | — | — | 158% | — | — |
| W insertion film thickness 0.4 nm | 132% | 157% | 167% | 160% | — |

As shown in FIG. 10(a) and Table 1, it is demonstrated that when the second non-magnetic layer 23 is made of Ta having thicknesses of 0.4 nm and 0.5 nm, and W having a thickness of 0.4 nm, the TMR ratio in the case where the first non-magnetic layer 22 is inserted is higher by about 10 to 40% than the case where the first non-magnetic layer 22 is not inserted (film thickness of 0 nm). In particular, when the second non-magnetic layer 23 is made of Ta having a thickness of 0.4 nm and the thickness of the first non-magnetic layer 22 is 0.3 nm and 0.4 nm, and when the second non-magnetic layer 23 is made of W having a thickness of 0.4 nm, and the film thickness of the first non-magnetic layer 22 is 0.2 nm, the TMR ratio becomes very high.

Next, when the thickness of the first non-magnetic layer 22 is 0.2 nm, the relationship between the TMR ratio, measured in the case where the second non-magnetic layer 23 is made of Ta and made of W, and the film thickness of the second non-magnetic layer 23 (0.2 nm to 0.5 nm) is shown in FIG. 10(b) and Table 2. Note here that in Table 2, the TMR ratio in the case where the second non-magnetic layer 23 is made of Ta having a thickness of 0.4 nm and made of W is also reprinted from Table 1.

TABLE 2

|  | Mg insertion film thickness (nm) | | | | |
| --- | --- | --- | --- | --- | --- |
|  | 0 | 0.1 | 0.2 | 0.3 | 0.4 |
| Ta insertion film thickness 0.2 nm | — | — | 18% | — | — |
| Ta insertion film thickness 0.3 nm | — | — | 65% | — | — |
| Ta insertion film thickness 0.4 nm | 130% | 142% | 150% | 165% | 170% |
| Ta insertion film thickness 0.5 nm | — | — | 150% | — | — |
| W insertion film thickness 0.2 nm | — | — | 160% | — | — |
| W insertion film thickness 0.3 nm | — | — | 165% | — | — |
| W insertion film thickness 0.4 nm | 132% | 157% | 167% | 160% | — |
| W insertion film thickness 0.5 nm | — | — | 162% | — | — |

As shown in FIG. 10(b) and Table 2, it is demonstrated that when the second non-magnetic layer 23 is made of Ta, the TMR ratio is higher when the film thickness is 0.4 nm and 0.5 nm. Furthermore, when the second non-magnetic layer 23 is made of W, the TMR ratio is high when the film thickness is in a range of 0.2 nm to 0.5 nm, and particularly high when the film thickness is in a range of 0.3 nm to 0.5 nm.

Next, FIG. 11(a) shows the relationship between the effective magnetic anisotropy energy density ($K_{eff}$) and the film thickness of the first non-magnetic layer (MgO) 22 (0 nm to 0.3 nm), measured when the second non-magnetic layer 23 is made of Ta, and the thickness is 0.5 nm. FIG. 11(a) also shows a value of $K_{eff}$ when the thickness of second non-magnetic layer 23 made of Ta is 0.3 nm and 0.4 nm, when the first non-magnetic layer 22 is not inserted (when the film thickness is 0 nm). As shown in FIG. 11(a), it is demonstrated that when the thickness of Ta of the second non-magnetic layer 23 is 0.5 nm, a value of $K_{eff}$ is 1.5 times higher or more when the first non-magnetic layer 22 is inserted as compared with the case where the first non-magnetic layer 22 is not inserted (when the film thickness is 0 nm). Since the thermal stability A is proportional to $K_{eff}$, it becomes 1.5 times higher or more than the case without including the first non-magnetic layer 22. Furthermore, it is demonstrated that when the first non-magnetic layer 22 is not inserted (when the film thickness is 0 nm), a value of $K_{eff}$ is high when the film thickness of Ta of the second non-magnetic layer 23 is 0.4 nm and 0.5 nm.

Next, FIG. 11(b) shows a value of $K_{eff}$ when the second non-magnetic layer 23 is made of W, having a thickness of 0.3 nm, 0.4 nm, and 0.5 nm, and when the first non-magnetic layer 22 is not inserted (when a film thickness is 0 nm). As shown in FIG. 11(b), it is demonstrated that when the first non-magnetic layer 22 is not inserted (when a film thickness is 0 nm), the value of $K_{eff}$ is high when a film thickness of the second non-magnetic layer 23 is 0.4 nm and 0.5 nm.

Figure 10:
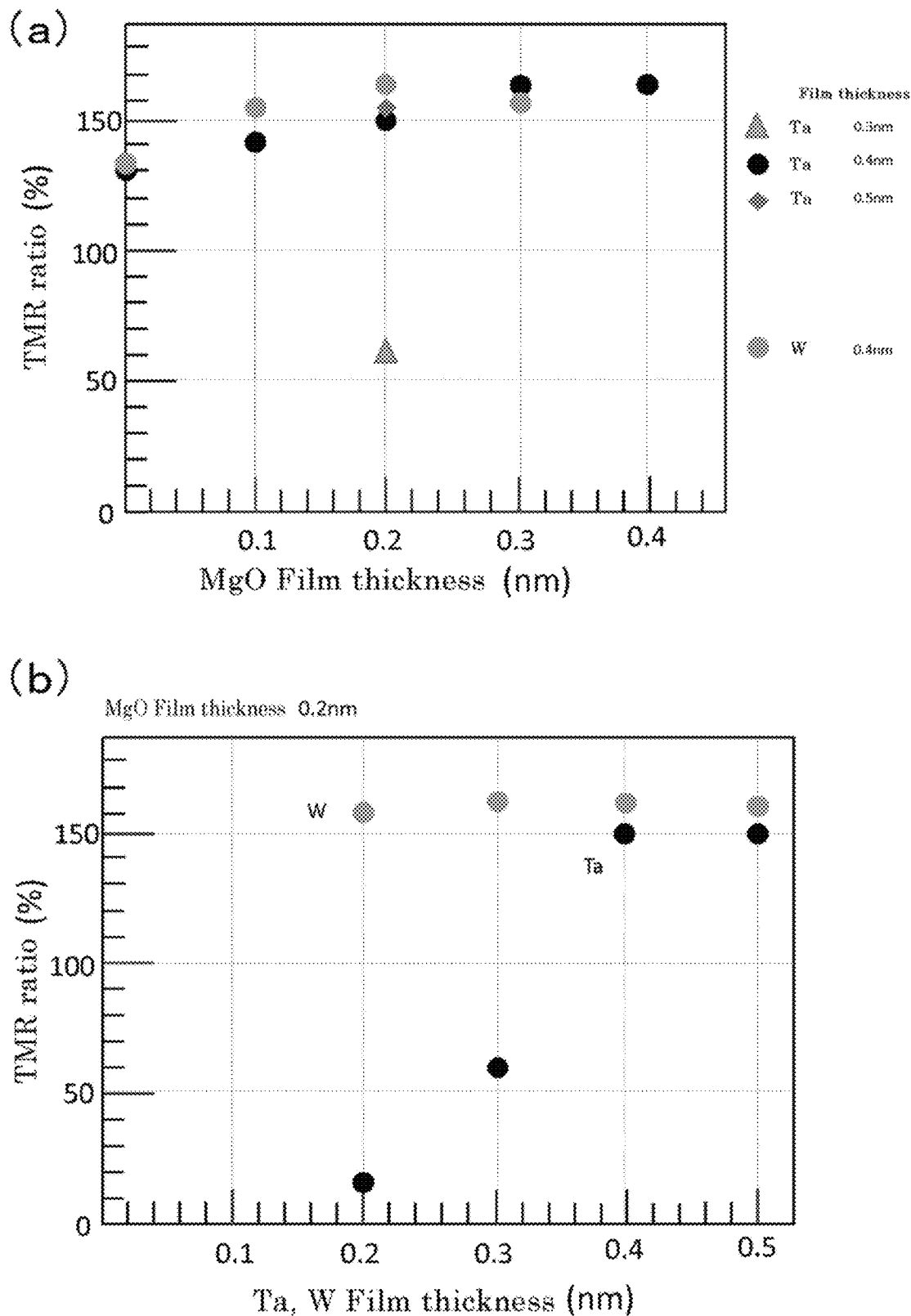
FIG. 10 is graphs showing (a) a relationship between a TMR ratio and a film thickness of a first non-magnetic layer (MgO), and (b) a relationship between a TMR ratio and a film thickness of a second non-magnetic layer (Ta or W) of the magnetic tunnel junction element shown in FIG. 9.
Figure 11:
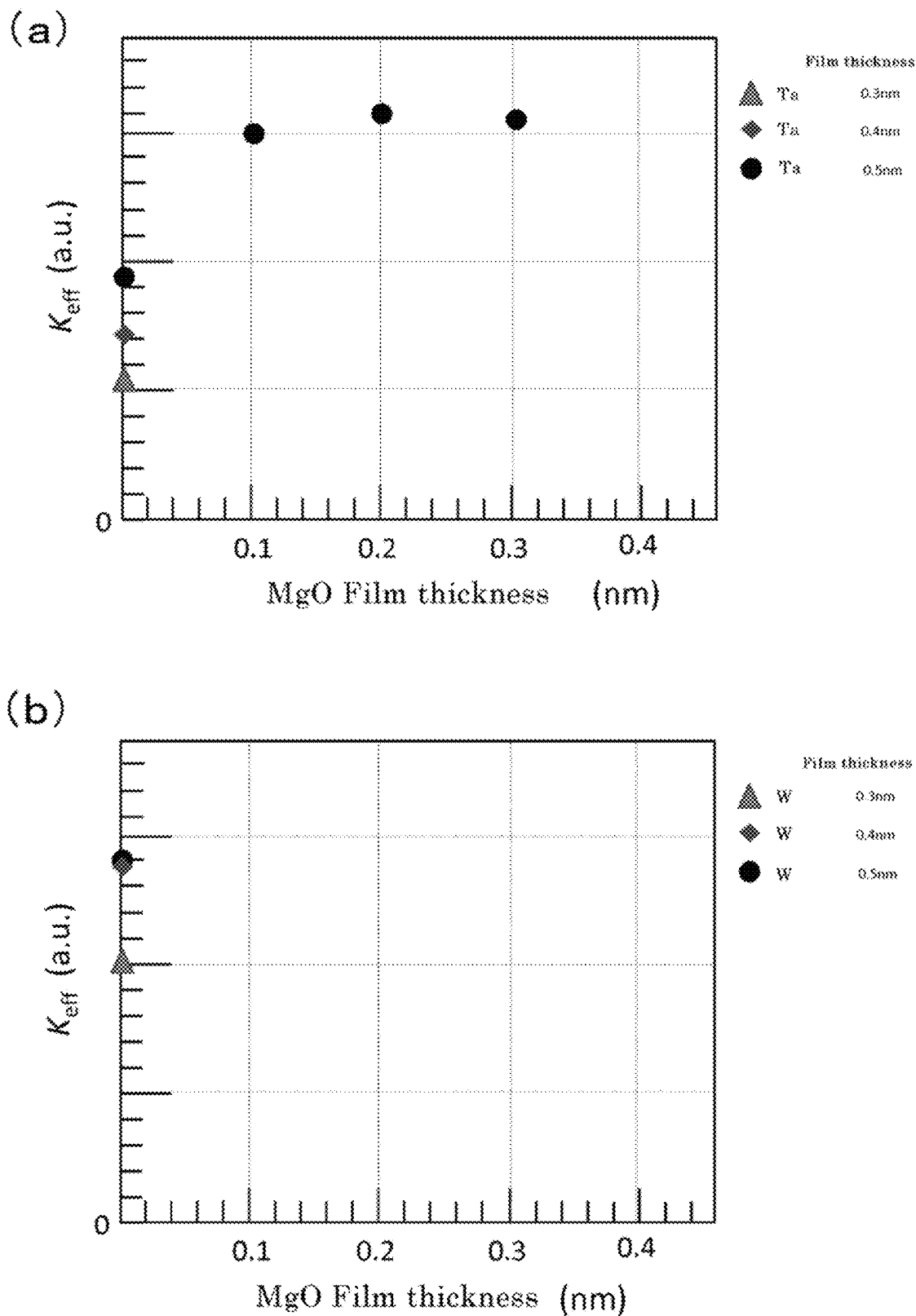
FIG. 11 is graphs showing a relationship between $K_{ea}$ and the film thickness of a first non-magnetic layer (MgO) of the magnetic tunnel junction element shown in FIG. 9 when the second non-magnetic layer is made of (a) Ta and (b) W.

The reason why the TMR ratio and the perpendicular magnetic anisotropy are thus improved seems to be because of the following reasons. In other words, in the case where the first non-magnetic layer 22 is not provided, when the second non-magnetic layer 23 is formed by sputtering or the like, Ta or W collides with and is driven into the first ferromagnetic layer 21, thereby damaging the first ferromagnetic layer 21. Furthermore, the driven Ta or W diffuses into the interface between the barrier layer 12 and the first ferromagnetic layer 21 by heat treatment after film formation. This diffused Ta or W causes deterioration in the TMR ratio and the perpendicular magnetic anisotropy. On the contrary, if the first non-magnetic layer 22 is formed earlier than the second non-magnetic layer 23, when the second non-magnetic layer 23 is formed by sputtering or the like, the first non-magnetic layer 22 can prevent Ta or W from colliding with and being driven into the first ferromagnetic layer 21. This makes it possible to prevent the first ferromagnetic layer 21 from being damaged and the recording layer 13 from being deteriorated. Furthermore, since materials such as Ta are not driven into first ferromagnetic layer 21, it is possible to prevent Ta or the like from diffusing into the first ferromagnetic layer 21 by heat treatment at the time of manufacture. Thus, it is considered that the TMR ratio and perpendicular magnetic anisotropy can be prevented from being deteriorated, and consequently, results shown in FIGS. 10 and 11 are obtained.

Example 3

Figure 12:
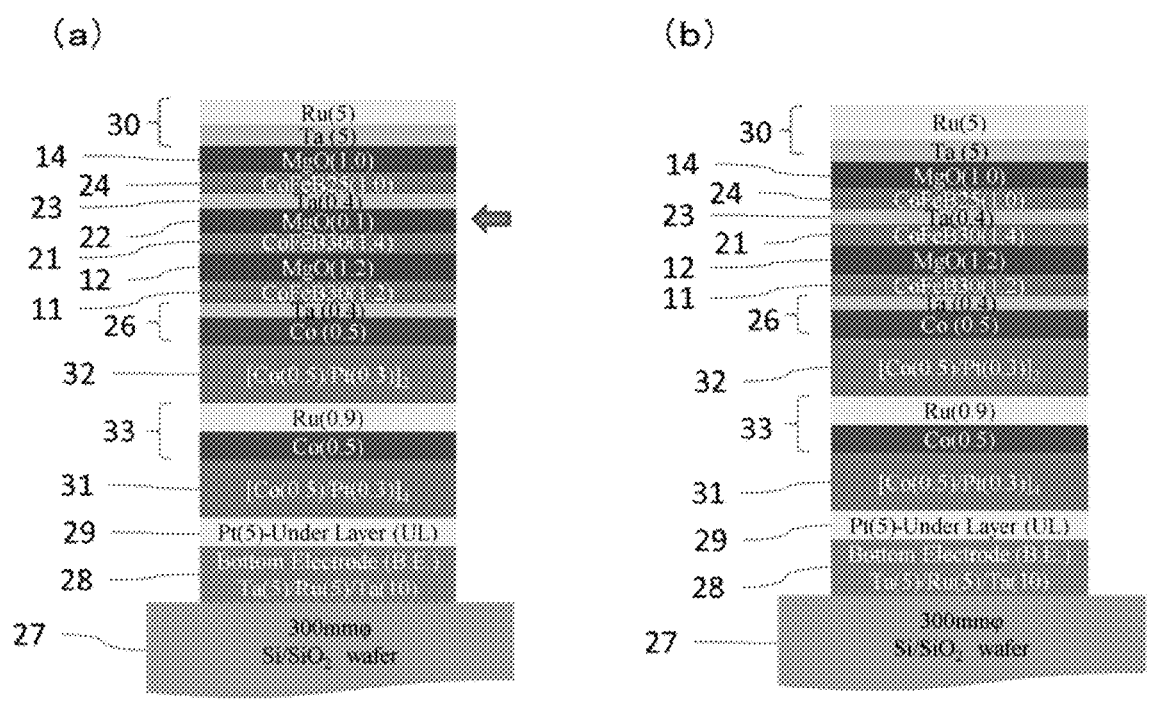
FIG. 12(a) is a sectional view showing a configuration used for third measurement of a magnetic tunnel junction element in an embodiment of the present invention; and (b) is a sectional view showing a magnetic tunnel junction element which does not include a first non-magnetic layer.

The TMR ratio was measured with a size (diameter) of a magnetic tunnel junction element 10 varied. As shown in FIG. 12(a), the magnetic tunnel junction element 10 used for the measurement has a configuration in which a bottom electrode layer 28 including a Ta film having a thickness of 10 nm, a Ru film having a thickness of 5 nm, and a Ta film having a thickness of 5 nm, an under layer 29 having a thickness of 5 nm and made of Pt, a third ferromagnetic layer 31 formed by stacking a Co film having a thickness of 0.5 nm and a Pt film having a thickness of 0.3 nm four times, a third non-magnetic layer 33 formed by stacking a Co film having a thickness of 0.5 nm and a Ru film having a thickness of 0.9 nm, a fourth ferromagnetic layer 32 formed by staking a Co film having a thickness of 0.5 nm and a Pt film having a thickness of 0.3 nm twice, a magnetic coupling layer 26 formed by stacking a Co film having a thickness of 0.5 nm and a Ta film having a thickness of 0.4 nm, a reference layer 11 having a thickness of 1.2 nm and made of CoFeB, a barrier layer 12 having a thickness of 1.2 nm and made of MgO, a first ferromagnetic layer 21 having a thickness of 1.4 nm and made of CoFeB, a first non-magnetic layer 22 having a thickness of 0.1 nm and made of MgO, a second non-magnetic layer 23 having a thickness of 0.4 nm and made of Ta, a second ferromagnetic layer 24 having a thickness of 1.0 nm and made of CoFeB, a protective layer 14 having a thickness of 1.0 nm and made of MgO, and a top electrode layer 30 including Ta film having a thickness of 5 nm and a Ru film having a thickness of thickness 5 nm are stacked in this order on a Si/SiO$_2$ substrate 27 having a diameter of 300 mm. Note here that the magnetic tunnel junction element 10 shown in FIG. 12(a) is manufactured by forming each layer followed by heat treatment at 400° C. for one hour.

Figure 13:
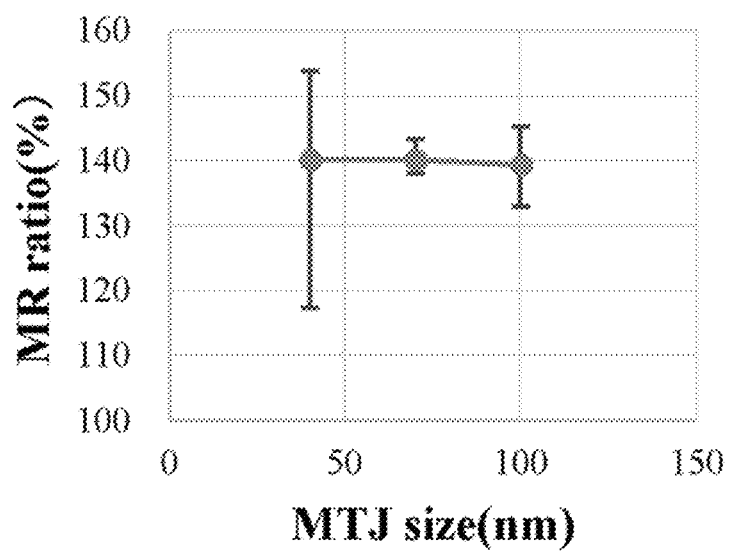
FIGS. 13(a) and (b) are graphs showing a relationship between the size and TMR ratio of the magnetic tunnel junction element shown in FIG. 12(a) and FIG. 12(b), respectively.
Figure 13:
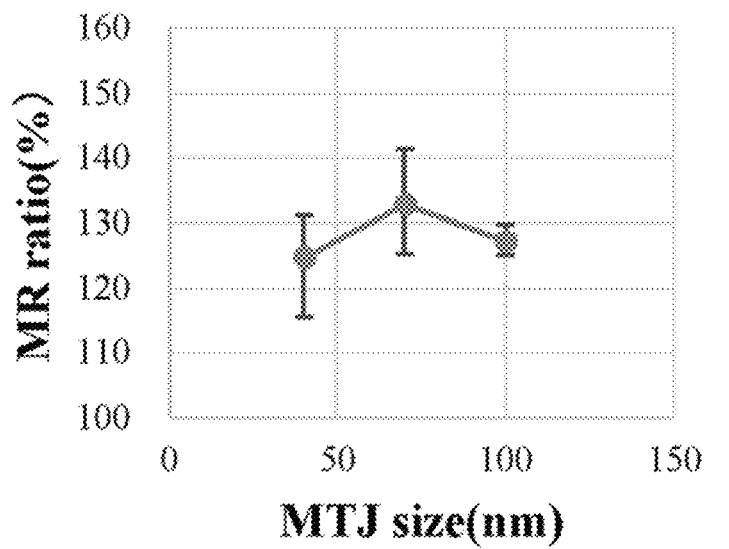

The magnetic tunnel junction elements 10 having sizes of 40 nm, 70 nm and 100 nm were manufactured and subjected to measurement of the TMR ratios thereof. Note here that for comparison, elements having the respective sizes without including the first non-magnetic layer 22 as shown in FIG. 12(b) were manufactured and subjected to the same measurement of the TMR ratio. The relationship between the measured TMR ratio and the size for the elements are shown in FIG. 13. As shown in FIGS. 13(a) and (b), it is demonstrated that, in any size, the TMR ratio is higher by about 10 to 15% in the elements in which the first non-magnetic layer 22 has been inserted than the elements in which the first non-magnetic layer 22 is not inserted.

Example 4

Figure 14:
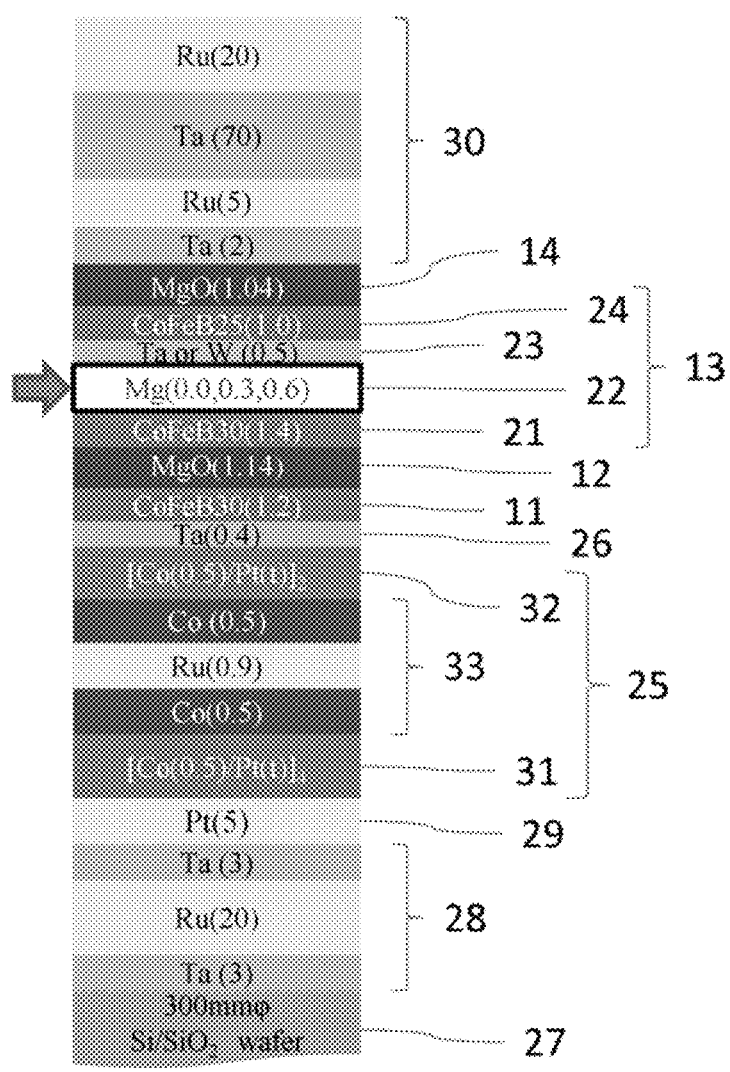
FIG. 14 a sectional view showing a configuration a magnetic tunnel junction element used for fourth measurement in which a first non-magnetic layer is made of Mg in an embodiment of the present invention.

A magnetic tunnel junction element 10 including a first non-magnetic layer 22 made of Mg was subjected to measurement of the magnetic property with a thickness of the first non-magnetic layer 22 and materials of the second non-magnetic layer 23 varied. As shown in FIG. 14, the magnetic tunnel junction element 10 used for measurement has a configuration in which a bottom electrode layer 28 including a Ta film having a thickness of 3 nm, a Ru film having a thickness of 20 nm, and a Ta film having a thickness of 3 nm, an under layer 29 having a thickness of 5 nm and made of Pt, a third ferromagnetic layer 31 formed by stacking a Co film having a thickness of 0.5 nm, a Pt film having a thickness of 0.3 nm four times, a third non-magnetic layer 33 formed by stacking a Co film having a thickness of 0.5 nm, a Ru film having a thickness of 0.9 nm, and a Co film having a thickness of 0.5 nm, a fourth ferromagnetic layer 32 formed by staking a Co film having a thickness of 0.5 nm and a Pt film having a thickness of 0.3 nm twice, a magnetic coupling layer 26 made of a Ta film having a thickness of 0.4 nm, a reference layer 11 having a thickness of 1.2 nm and made of CoFeB, a barrier layer 12 having a thickness of 1.14 nm and made of MgO, a first ferromagnetic layer 21 having a thickness of 1.4 nm and made of CoFeB, a first non-magnetic layer 22 made of Mg, a second non-magnetic layer 23 having a thickness of 0.5 nm, a second ferromagnetic layer 24 having a thickness of 1.0 nm and made of CoFeB, a protective layer 14 having a thickness of 1.04 nm and made of MgO, and a top electrode layer 30 including a Ta film having a thickness of 2 nm, a Ru film having a thickness of 5 nm, a Ta film having a thickness of 70 nm, and a Ru film having a thickness of 20 nm are stacked in this order on a Si/SiO$_2$ substrate 27 having a diameter of 300 mm. Note here that the magnetic tunnel junction element 10 shown in FIG. 14 is manufactured by forming each layer followed by heat treatment at 400° C. for one hour.

Figure 15:
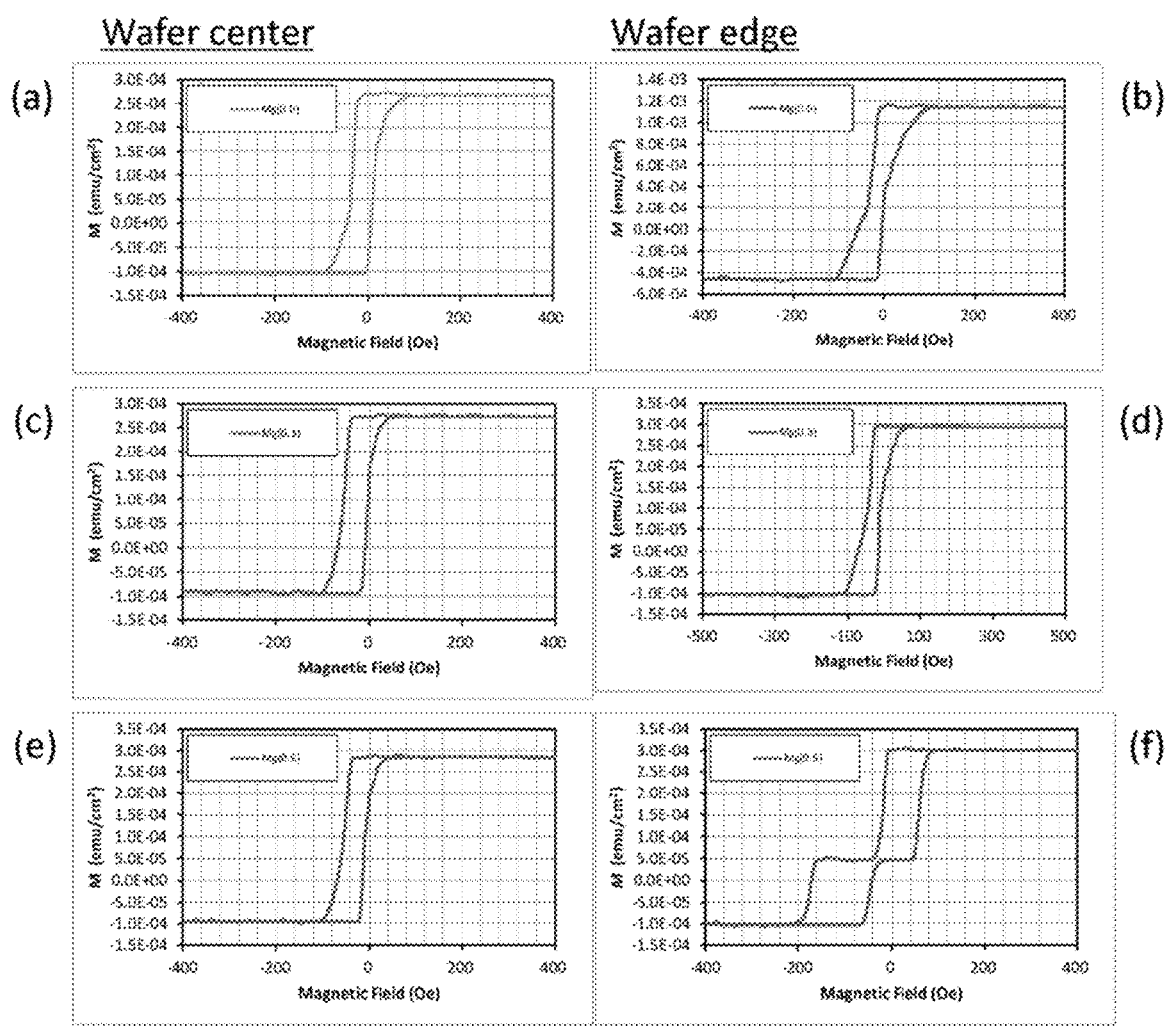
FIG. 15 is graphs showing magnetization curves of the magnetic tunnel junction element shown in FIG. 14 in the vertical direction (Out-of-plane) when a thickness of Mg of a first non-magnetic layer 22 is 0 nm measured (a) in the wafer center and (b) in the wafer edge; when the thickness is 0.3 nm measured (c) in the wafer center and (d) in the wafer edge; and when the thickness is 0.6 nm measured (e) in the wafer center and (f) in the wafer edge.

Magnetization curves in the vertical direction (Out-of-plane), when the second non-magnetic layer 23 is made of Ta, and a thickness of Mg of the first non-magnetic layer 22 is 0 nm (without including the first non-magnetic layer 22), 0.3 nm, and 0.6 nm, measured in the wafer center are shown in FIGS. 15(a), (c), and (e), and the magnetization curves measured in the wafer edge are shown in FIGS. 15(b), (d), and (f). As shown in FIGS. 15(a) to (f), it is demonstrated that in the vertical direction, the magnetization curve is non-linear and has a hysteresis curve, and the perpendicular magnetic property is obtained. Furthermore, as shown in FIG. 15(f), when the film thickness of the first non-magnetic layer 22 is 0.6 nm, the first ferromagnetic layer 21 and the second ferromagnetic layer 24 are anti-ferromagnetically coupled at the wafer edge.

Figure 16:
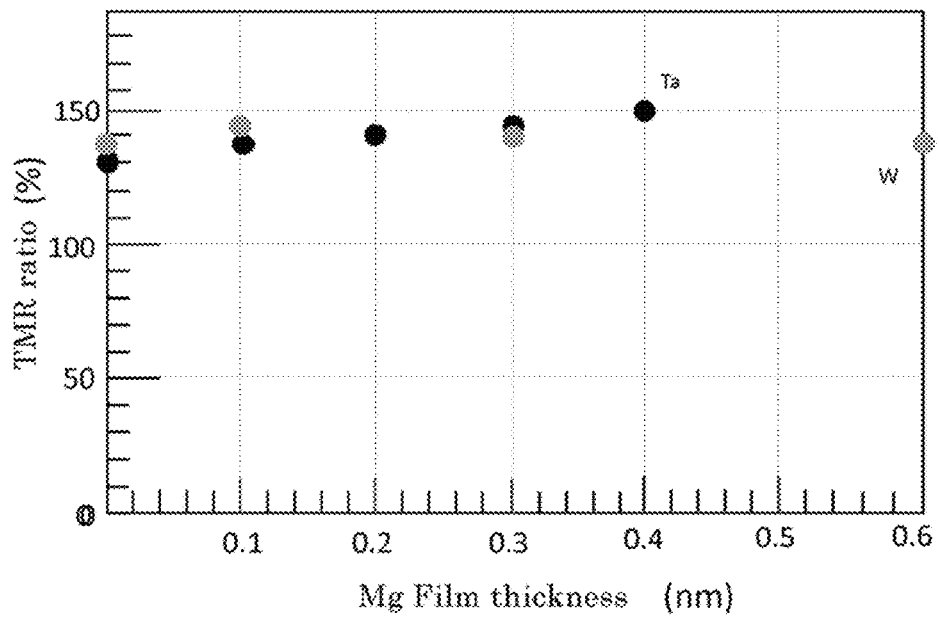
FIG. 16 is a graph showing a relationship between a TMR ratio and a film thickness of the first non-magnetic layer (Mg) of the magnetic tunnel junction element shown in FIG. 14.

Next, a relationship between the TMR ratio and a film thickness of the first non-magnetic layer 22 (Mg) (0 nm to 0.6 nm) measured when the second non-magnetic layer 23 (film thickness: 0.5 nm) is made of Ta and made of W are shown in FIG. 16 and Table 3.

TABLE 3

| | Mg insertion film thickness (nm) | | | | | |
|---|---|---|---|---|---|---|
| | 0 | 0.1 | 0.2 | 0.3 | 0.4 | 0.6 |
| Ta insertion film thickness 0.5 nm | 130% | 135% | 140% | 145% | 150% | — |
| W insertion film thickness 0.5 nm | 138% | 145% | — | 140% | — | 135% |

As shown in FIG. 16 and Table 3, both in the case where the second non-magnetic layer 23 is made of Ta and made of W, it is demonstrated that the TMR is higher by about 2 to 20% when Mg of the first non-magnetic layer 22 is inserted to a film thickness of 0.1 nm to 0.4 nm as compared with the case where the first non-magnetic layer 22 is not included (when the film thickness is 0 nm). Thus, even when the first non-magnetic layer 22 is made of Mg, similar to the case where the first non-magnetic layer 22 is made of MgO (see, for example, FIG. 10), it can be said that the TMR ratio is improved. Furthermore, the perpendicular magnetic anisotropy is considered to be improved as in the case where the first non-magnetic layer 22 is made of MgO (see, for example, FIG. 11).

Example 5

Figure 17:
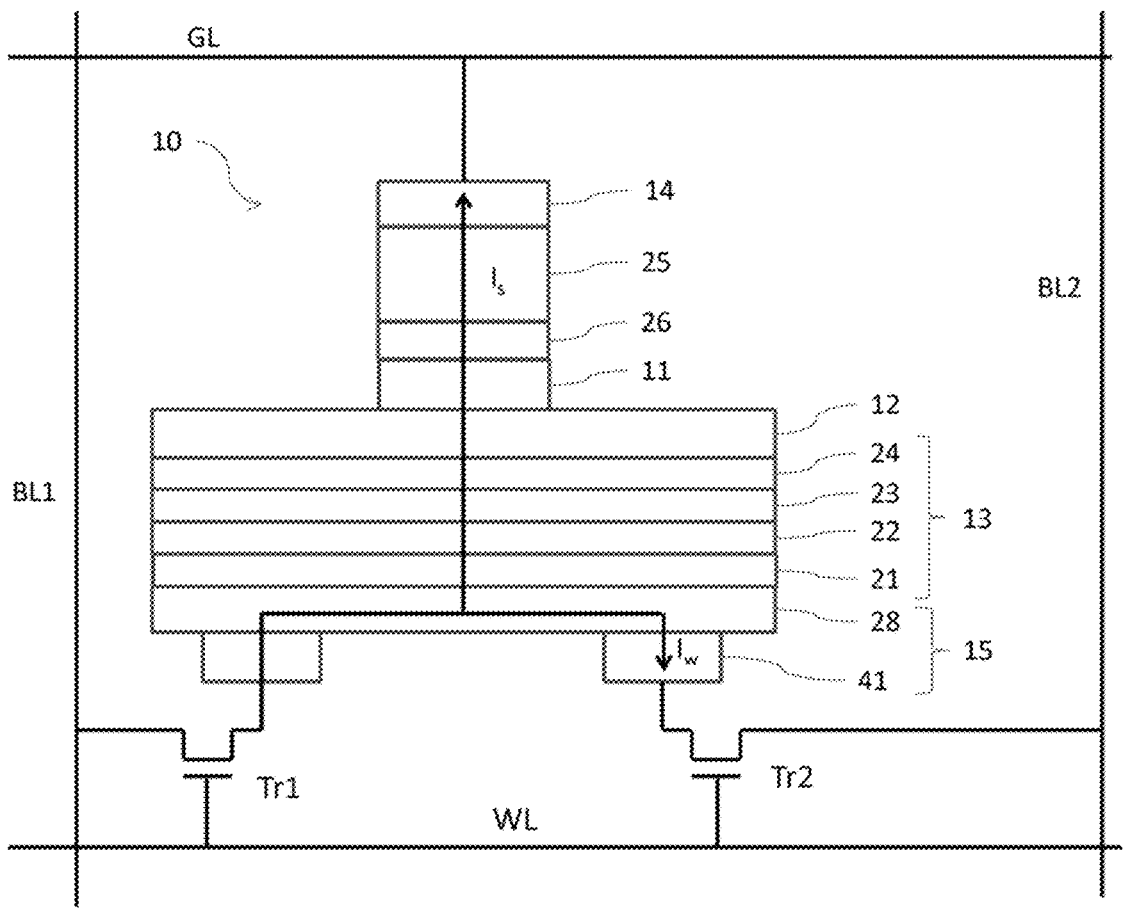
FIG. 17 is a block circuit diagram of a magnetic memory when the magnetic tunnel junction element in an embodiment of the present invention is applied to a three-terminal SOT element.

The present invention can be applied not only to an STT element, but also to a three-terminal Spin Orbit Torque (SOT). FIG. 17 shows a block circuit diagram of a magnetic memory when the present invention is applied to the SOT element. As shown in FIG. 17, in the magnetic tunnel junction element 10, a bottom electrode layer 28, a first ferromagnetic layer 21, a first non-magnetic layer 22, a second non-magnetic layer 23, a second ferromagnetic layer 24, a barrier layer 12, a reference layer 11, a magnetic coupling layer 26, a fixed layer 25, and a protective layer 14 are sequentially stacked on a bottom connection layer 41. Note here that in FIG. 17, the bottom connection layer 41 and the bottom electrode layer 28 constitute a base layer 15. Furthermore, the recording layer 13 includes the first ferromagnetic layer 21, the first non-magnetic layer 22, the second non-magnetic layer 23, and the second ferromagnetic layer 24, and they are stacked such that the first non-magnetic layer 22 is closer to a base layer 15 side than second non-magnetic layer 23. In the magnetic tunnel junction element 10, the magnetization of the recording layer 13 is reversed by spin orbit interaction generated when a writing current $I_w$ flows in a conductive layer from the bottom electrode layer 28 to the second ferromagnetic layer 24.

In a magnetic memory cell shown in FIG. 17, the magnetic tunnel junction element 10 is connected to a bit line BL1, a bit line BL2, a word WL1, and a ground line GL. In other words, a terminal communicating to the upper part of the magnetic tunnel junction element 10 is connected to the ground line GL. Furthermore, both ends of the bottom electrode layer 28 are connected to a source or drain of a first cell transistor Tr1 and a second cell transistor Tr2 via the bottom connection layer 41. The gate electrodes of the first cell transistor Tr1 and the second cell transistor Tr2 are connected to the word line WL. Furthermore, terminals opposite side to a side connected to the magnetic tunnel junction element 10 in the source and the drain of the first cell transistor Tr1 and the second cell transistor Tr2 are connected to the first bit line BL1 and the second bit line BL2, respectively.

In this magnetic memory cell, in writing information, when the word line WL is set at High level, the first cell transistor Tr1 and the second cell transistor Tr2 are in an ON state. Furthermore, when any one of the first bit line BL1 and the second bit line BL2 is set at High, information can be written into the magnetic tunnel junction element 10.

In reading out information, when the word line WL is set at High level, the first cell transistor Tr1 and the second cell transistor Tr2 are in an ON state. Furthermore, when both the first bit line BL1 and the second bit line BL22 are set at High, or when one is set at High and the other is set at Open, information can be read out from the magnetic tunnel junction element 10.

The embodiments described above are not intended to limit the scope of right of the present invention and are intended to illustrate only examples. Various modifications are possible without departing from the gist of the technology. For example, a film thickness of each layer described in each drawing is just an example.

REFERENCE SIGNS LIST 10 magnetic tunnel junction element
11 reference layer
12 barrier layer
13 recording layer
21 first ferromagnetic layer
22 first non-magnetic layer
23 second non-magnetic layer
24 second ferromagnetic layer
14 protective layer
15 base layer
25 fixed layer
31 third ferromagnetic layer
32 fourth ferromagnetic layer
33 third non-magnetic layer 26 magnetic coupling layer
27 substrate
28 bottom electrode layer
29 under layer
30 top electrode layer
41 bottom connection layer

What is claimed is:

1. A magnetic tunnel junction element comprising:
   a reference layer including a ferromagnetic body, and having a magnetization direction fixed in a direction perpendicular to a film plane;
   a barrier layer including a non-magnetic body, and disposed on one surface side of the reference layer; and
   a recording layer disposed on a surface side of the barrier layer opposite to the reference layer;
   wherein the recording layer includes
      a first ferromagnetic layer including at least one of Co and Fe, and having a magnetization direction variable in a direction perpendicular to a film plane;
      a first non-magnetic layer including at least one of Mg, MgO, C, Li, Al, and Si, and disposed on one surface side of the first ferromagnetic layer;
      a second non-magnetic layer including at least one of Ta, Hf, W, Mo, Nb, Zr, Y, Sc, Ti, V, and Cr, disposed directly in contact with a surface of the first non-magnetic layer on a side of the first non-magnetic layer opposite to that of the first ferromagnetic layer, and having a thickness of 0.3 to 2.0 nm; and
      a second ferromagnetic layer including at least one of Co and Fe, having a magnetization direction variable in the direction perpendicular to a film plane, and disposed on one surface side of the second non-magnetic layer opposite to that of the first non-magnetic layer, and
   wherein the barrier layer is disposed on at least one of a surface side of the first ferromagnetic layer opposite to that of the first non-magnetic layer, and a surface side of the second ferromagnetic layer opposite to that of the second non-magnetic layer.

2. The magnetic tunnel junction element according to claim 1, comprising a protective layer including a non-magnetic body and disposed on a surface side of the recording layer opposite to the barrier layer.

3. The magnetic tunnel junction element according to claim 2, wherein the first ferromagnetic layer and the second ferromagnetic layer are brought into contact with the barrier layer or the protective layer, respectively, and have a magnetization direction being perpendicular to a film plane by interface perpendicular magnetic anisotropy of the barrier layer or the protective layer in contact.

4. The magnetic tunnel junction element according to claim 1, wherein the first non-magnetic layer has a thickness of 0.1 to 1.0 nm.

5. The magnetic tunnel junction element according to claim 1, comprising a base layer for forming at least the reference layer, the barrier layer, and the recording layer on one surface side,
   wherein in the recording layer, the first non-magnetic layer is disposed closer to the base layer than the second non-magnetic layer.

6. The magnetic tunnel junction element according to claim 1, wherein the first ferromagnetic layer and the second ferromagnetic layer are magnetically coupled to each other via the first non-magnetic layer and the second non-magnetic layer.

7. A magnetic memory comprising:
   a plurality of source lines disposed in parallel to each other;
   a plurality of word lines disposed in parallel to each other in a direction crossing the source lines;
   a plurality of bit lines disposed in parallel to the source lines;
   a selection transistor including a gate electrode electrically connected to any one of the word lines, and a source electrode electrically connected to any one of the source lines; and
   a magnetic tunnel junction element according to claim 1, in which any one of the first ferromagnetic layer and the second ferromagnetic layer is electrically connected to a drain electrode of the selection transistor, and the other of the first ferromagnetic layer and the second ferromagnetic layer is electrically connected to any one of the bit lines,
   wherein a current can be applied in a direction perpendicular to a film plane of the magnetic tunnel junction element.

8. The magnetic memory according to claim 7, comprising:
   a plurality of storage cells each including the selection transistor and the magnetic tunnel junction element and having different combinations of a word line, a bit line, and a source line, which are electrically connected one another;
   a writing unit configured to select any one of the storage cells and to write data in the selected storage cell via each word line, each bit line, and each source line; and
   a read-out unit configured to select any one of the storage cells and to read out data from the selected storage cell via each word line, each bit line, and each source line.

* * * * *